US011540424B2

(12) United States Patent
Nozuki et al.

(10) Patent No.: US 11,540,424 B2
(45) Date of Patent: Dec. 27, 2022

(54) ELECTRIC POWER CONVERTER

(71) Applicant: Mitsubishi Electric Corporation, Tokyo (JP)

(72) Inventors: Yoshikazu Nozuki, Tokyo (JP); Koji Nakajima, Tokyo (JP); Kenichi Tamura, Tokyo (JP); Taro Kimura, Tokyo (JP); Yu Kishiwada, Tokyo (JP); Masaya Nonomura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 53 days.

(21) Appl. No.: 17/257,882

(22) PCT Filed: Aug. 26, 2019

(86) PCT No.: PCT/JP2019/033283
§ 371 (c)(1),
(2) Date: Jan. 5, 2021

(87) PCT Pub. No.: WO2020/054376
PCT Pub. Date: Mar. 19, 2020

(65) Prior Publication Data
US 2021/0274678 A1 Sep. 2, 2021

(30) Foreign Application Priority Data
Sep. 14, 2018 (JP) .............................. JP2018-172677

(51) Int. Cl.
*H05K 7/20* (2006.01)
*H02M 3/335* (2006.01)
*H01L 25/18* (2006.01)
*H05K 1/14* (2006.01)
*H02M 3/00* (2006.01)

(52) U.S. Cl.
CPC ............ *H05K 7/209* (2013.01); *H05K 7/205* (2013.01); *H01L 25/18* (2013.01); *H02M 3/003* (2021.05);
(Continued)

(58) Field of Classification Search
None
See application file for complete search history.

(56) References Cited

U.S. PATENT DOCUMENTS 5,262,587 A * 11/1993 Moser ................ H05K 7/20636
174/15.1
6,665,184 B2 * 12/2003 Akselband ................ F28F 3/12
174/15.1
(Continued)

FOREIGN PATENT DOCUMENTS

JP 4231626 B2 3/2009
JP 5071558 B2 11/2012
(Continued)

OTHER PUBLICATIONS

International Search Report (PCT/ISA/210) with translation and Written Opinion (PCT/ISA/237) dated Oct. 8, 2019, by the Japan Patent Office as the International Searching Authority for International Application No. PCT/JP2019/033283.

*Primary Examiner* — Courtney L Smith
(74) *Attorney, Agent, or Firm* — Buchanan Ingersoll & Rooney PC

(57) ABSTRACT

Provided is an electric power converter, including: a casing; a heat radiating plate having a first main surface and a second main surface; and a substrate which is fixed to the main surface and to which a heat generating component is mounted, wherein the casing has an inner wall surface in which a first tapered portion is formed, wherein the heat radiating plate includes a second tapered portion which is connected to the first tapered portion in a heat exchangeable manner and slid with respect to the first tapered portion, wherein the heat radiating plate is configured to be displaced in a first direction with respect to the casing by the second tapered portion being slid with respect to the first tapered portion, and wherein the heat generating component is connected to the casing in a heat exchangeable manner by the heat radiating plate being displaced in the first direction.

15 Claims, 29 Drawing Sheets

(52) U.S. Cl.
CPC ......... *H02M 3/33573* (2021.05); *H05K 1/144* (2013.01); *H05K 2201/066* (2013.01); *H05K 2201/09063* (2013.01); *H05K 2201/10409* (2013.01)

(56) References Cited

U.S. PATENT DOCUMENTS

| | | | | |
|---|---|---|---|---|
| 6,771,504 | B2 * | 8/2004 | Barcley | H05K 7/20545 361/704 |
| 6,796,372 | B2 * | 9/2004 | Bear | F28F 13/00 165/185 |
| 6,873,528 | B2 * | 3/2005 | Hulan | H05K 7/20545 174/16.3 |
| 8,233,279 | B2 * | 7/2012 | Sporer | H05K 7/20545 361/720 |
| 8,289,710 | B2 * | 10/2012 | Spearing | H05K 7/20781 361/699 |
| 10,279,653 | B2 * | 5/2019 | Takagi | H01L 23/3675 |
| 10,411,443 | B2 * | 9/2019 | Hansen | H05K 7/20936 |
| 2007/0042514 | A1 * | 2/2007 | Wu | G06F 1/183 361/688 |
| 2011/0235278 | A1 | 9/2011 | Hara | |
| 2017/0339805 | A1 * | 11/2017 | Lassini | H05K 7/20545 |
| 2020/0100353 | A1 | 3/2020 | Tanaka et al. | |

FOREIGN PATENT DOCUMENTS

| | | | |
|---|---|---|---|
| JP | 2014204487 A | 10/2014 |
| JP | 2018164324 A | 10/2018 |

\* cited by examiner

ELECTRIC POWER CONVERTER

TECHNICAL FIELD

The present invention relates to an electric power converter which converts an input voltage to a desired voltage level to output the converted voltage.

BACKGROUND ART

In related-art electric power converters, heat of a heat generating component such as an electronic component mounted on a substrate accommodated in a casing is transferred to the casing via a metal plate or other heat radiating member to perform cooling with the use of a cooling device mounted to the casing (see, for example, Patent Literature 1).

CITATION LIST

Patent Literature

[PTL 1] JP 4231626 B2

SUMMARY OF INVENTION

Technical Problem

In such a related-art electric power converter, the heat of the heat generating component mounted on the substrate is transferred to the casing via the metal plate or other heat radiating member to perform cooling with the use of the cooling device mounted to the casing. Thus, an effect of cooling the heat generating component mounted on the substrate far from the cooling device is low. When there are many heat generating components that generate a large amount of heat, a larger cooling surface area is therefore required, which results in a problem of increasing the size of an apparatus.

The present invention has been made to solve the above-mentioned problem, and has an object to achieve a compact electric power converter which is capable of effectively radiating heat of a heat generating component.

Solution to Problem

An electric power converter according to the present invention includes: a casing; a heat radiating unit configured to radiate heat of the casing to an outside; a first heat radiating plate having a first main surface and a second main surface which are opposite to each other; and a first substrate which is fixed to the first main surface and to which a first heat generating component is mounted, wherein the casing has an inner side surface in which a first tapered portion is formed, wherein the first heat radiating plate includes a second tapered portion which is connected to the first tapered portion in a heat exchangeable manner and slid with respect to the first tapered portion, wherein the first heat radiating plate is configured to be displaced in a first direction with respect to the casing by the second tapered portion being slid with respect to the first tapered portion, and wherein the first heat generating component is connected to the casing in a heat exchangeable manner by the first heat radiating plate being displaced in the first direction.

Advantageous Effects of Invention

According to the present invention, it is possible to provide the compact electric power converter which is capable of effectively radiating heat of the heat generating component.

DESCRIPTION OF EMBODIMENTS

First Embodiment

Figure 1:
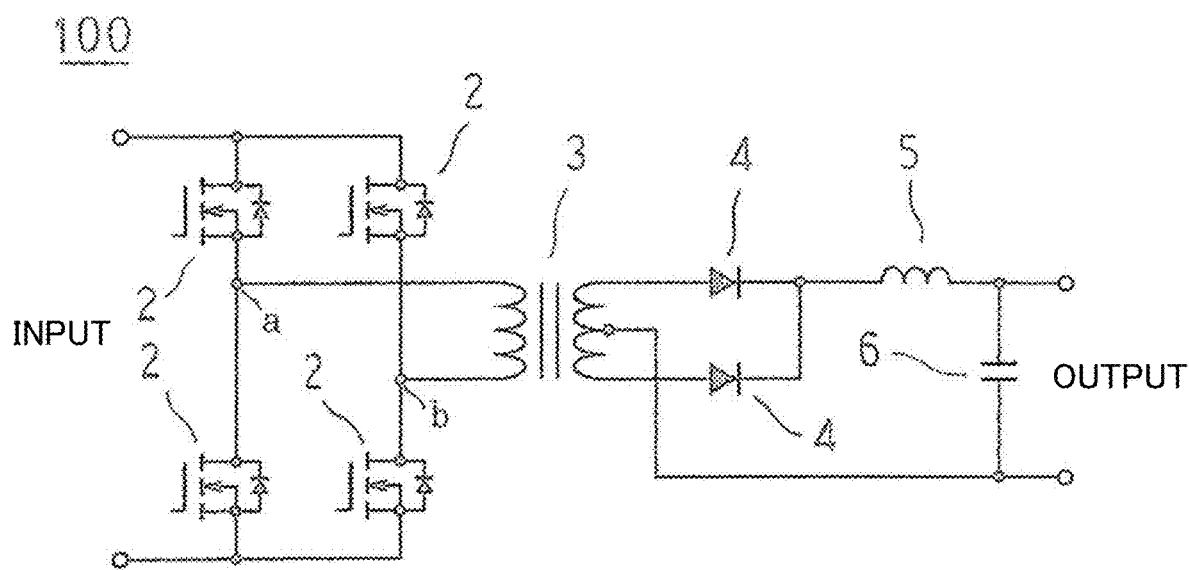
FIG. 1 is a circuit diagram for illustrating an electric power converter according to a first embodiment of the present invention.

FIG. 1 is a circuit diagram of an electric power converter according to a first embodiment of the present invention.

In FIG. 1, an electric power converter 100 is a DC-DC converter to be mounted to an electric vehicle, for example, and is configured to convert an input voltage of a lithium-ion battery that is 100 V to 300 V into a voltage of 12 to 15 V to output the converted voltage, to thereby charge a lead storage battery. The electric power converter 100 includes four metal oxide semiconductor field effect transistors (MOSFETs) 2, a transformer 3, two diodes 4, a smoothing reactor 5, and a smoothing capacitor 6.

The four MOSFETs 2 are controlled to be switched so as to convert an input voltage into an AC voltage. The transformer 3 converts the AC voltage converted by the four MOSFETs 2 into a desired voltage in accordance with a turn ratio of the transformer 3 to supply the converted voltage to an output-side circuit. Further, the transformer 3 electrically isolates an input-side circuit and the output-side circuit from each other. Each diode 4 converts the AC voltage supplied from the transformer 3 back to a DC voltage. The smoothing reactor 5 and the smoothing capacitor 6 smooth the DC voltage converted by each diode 4 to stabilize the output voltage.

The electric power converter 100 thus configured includes heat generating components, for example, the four MOSFETs 2, the transformer 3, the two diodes 4, and the smoothing reactor 5. It is required to cool those heat generating components so that the temperatures thereof fall below a rated temperature, for example, fall within a range of 100° C. or more and 120° C. or less.

Figure 2:
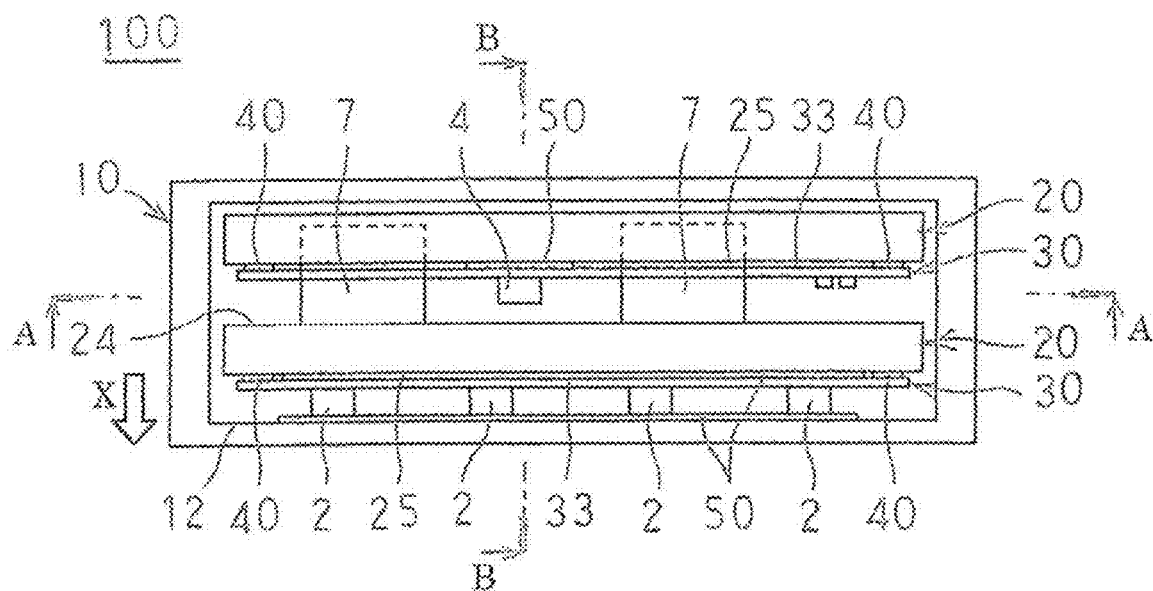
FIG. 2 is a top view of the electric power converter according to the first embodiment of the present invention.
Figure 3:
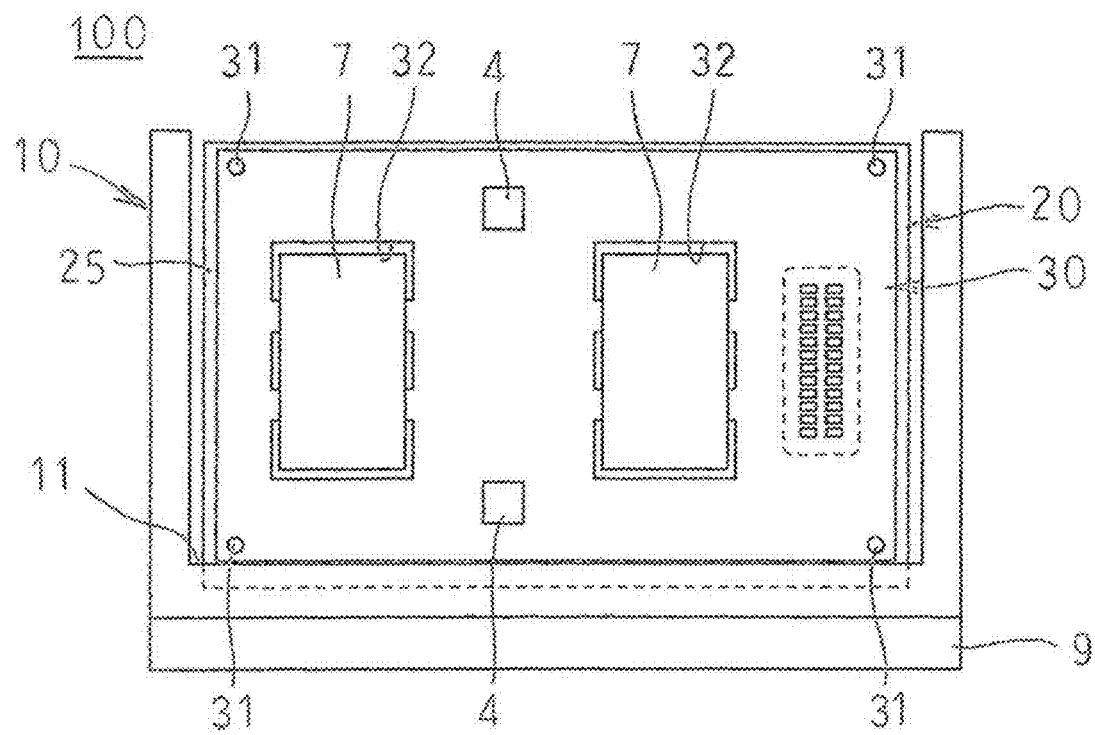
FIG. 3 is a sectional view taken along the arrow line A-A of FIG. 2.
Figure 4:
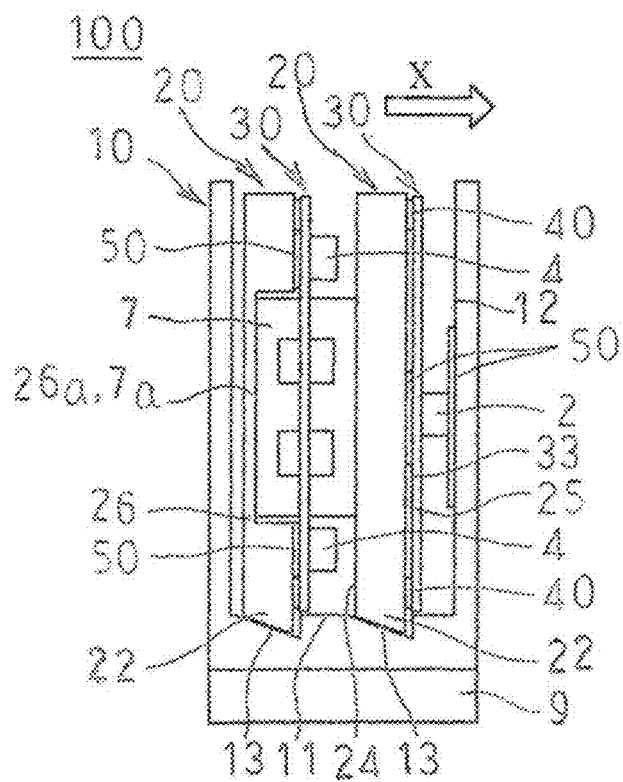
FIG. 4 is a sectional view taken along the arrow line B-B of FIG. 2.

Now, a specific configuration of the electric power converter 100 is described. FIG. 2 is a top view of the electric power converter according to the first embodiment of the present invention. FIG. 3 is a sectional view taken along the arrow line A-A of FIG. 2. FIG. 4 is a sectional view taken along the arrow line B-B of FIG. 2. In FIG. 2 and FIG. 4, an X direction indicated by the arrow is an arrangement direction of substrates fixed to heat radiating plates in a casing. In the sectional views, hatching is omitted for convenience.

The electric power converter 100 includes a casing 10 and a cooling device 9. The cooling device 9 is mounted in contact with an outer wall surface of the casing 10. The outer wall surface of the casing 10 is hereinafter also referred to as "outer side surface". The casing 10 has a box-like shape having, for example, a width of 150 mm, a height of 90 mm, and a depth of 50 mm. The casing 10 is made of a highly conductive material, for example, aluminum. An inner wall surface of the casing 10 opposite to the outer wall surface of the casing 10 with which the cooling device 9 is in contact is referred to as "main cooling surface 11". The inner wall surface of the casing 10 is hereinafter also referred to as "inner side surface". The main cooling surface 11 is an inner bottom surface of the box-like casing 10. The casing 10 and the cooling device 9 are formed of different members, but may be formed of the same member.

In the main cooling surface 11 of the casing 10, a first tapered portion 13 is formed. A heat radiating plate 20 having a substrate 30 fixed thereto is inserted into the casing 10 perpendicularly to the main cooling surface 11. Specifically, two heat radiating plates 20 are accommodated while being arranged in a row in the X direction. The number of substrates 30 and the number of heat radiating plates 20 to be inserted into the casing 10 may each be three or more. Further, the number of substrates 30 and the number of heat radiating plates 20 are not required to be the same.

On the substrate 30, a plurality of heat generating components and a plurality of electronic components are mounted. Although not shown, the substrate 30 has a copper wiring pattern, for example. The plurality of heat generating components and the plurality of electronic components are soldered to the wiring pattern and thus electrically connected to each other. Further, the two substrates 30 are electrically connected to each other through wirings as described later. With this connection, the DC-DC converter illustrated in FIG. 1 is obtained. The substrate 30 has substrate fixing holes 31 and core-specific openings 32. Further, although not shown, for example, copper coil patterns forming windings of the smoothing reactor 5 and the transformer 3 are formed around the core-specific openings 32 in the substrate 30, respectively. The heat generating components include power semiconductors, specifically, the MOSFETs 2 and the diodes 4, and cores 7 of the smoothing reactor 5 and the transformer 3. The substrate 30 has a size measuring, for example, 125 mm in width, 75 mm in height, and 1.6 mm in thickness.

Figure 6:
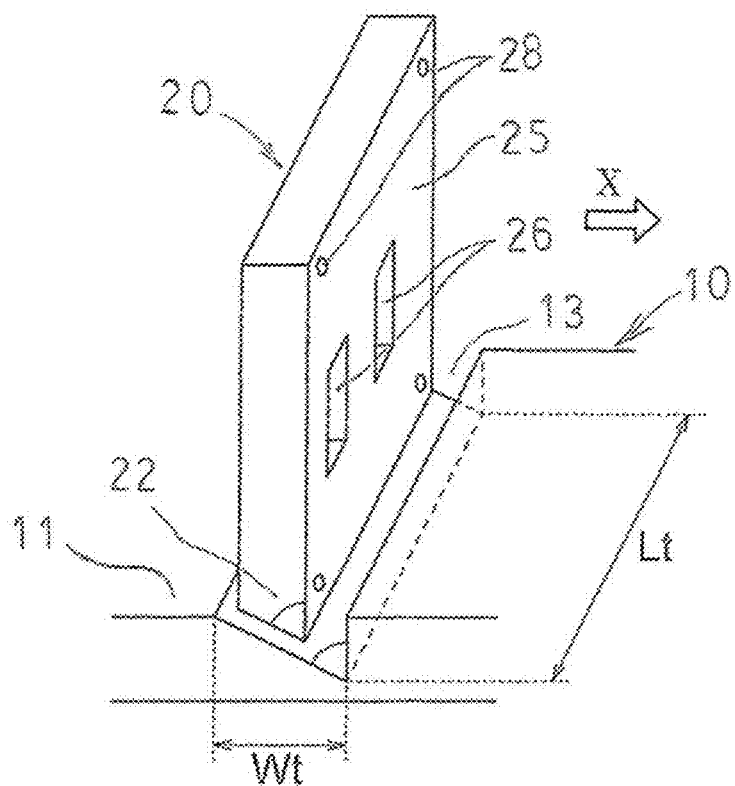
FIG. 6 is a perspective view of main components for illustrating the structure of a heat radiating plate in the electric power converter according to the first embodiment of the present invention.

The heat radiating plate 20 includes a substrate fixing surface 25, a component contact surface 24, and a second tapered portion 22. As illustrated in FIG. 6, the substrate fixing surface 25 has screw holes 28 for holding the substrate 30. The component contact surface 24 is brought into contact with the heat generating components, for example, the cores 7 mounted to the substrate 30 fixed to the other heat radiating plate 20. The heat radiating plate 20 has a size measuring, for example, 130 mm in width, 80 mm in height, and 9 mm in thickness. The heat radiating plate 20 is made of a highly conductive material, for example, aluminum.

The substrate 30 is fixed to the substrate fixing surface 25 of the heat radiating plate 20 by inserting spacers 40 at positions corresponding to the substrate fixing holes 31 and fastening screws through the substrate fixing hole 31 to the screw holes 28. The substrate fixing surface 25 and a substrate surface 33 that face each other keep their distance of, for example, 1 mm through use of the spacers 40. An insulating heat radiating sheet 50 is provided between the substrate fixing surface 25 and the substrate surface 33 so as to include a mounting area for the power semiconductor, for example, the MOSFET 2 and the diode 4 on the substrate 30 as viewed from the X direction. An insulating potting resin may be provided, in place of the heat radiating sheet 50, between the substrate fixing surface 25 and the substrate surface 33. Further, when it is not required to electrically isolate the substrate fixing surface 25 and the substrate surface 33 facing the substrate fixing surface 25 from each other, the substrate fixing surface 25 and the substrate surface 33 may be brought into contact with each other. The heat radiating sheet 50 and the potting resin are heat conductive members.

Figure 5:
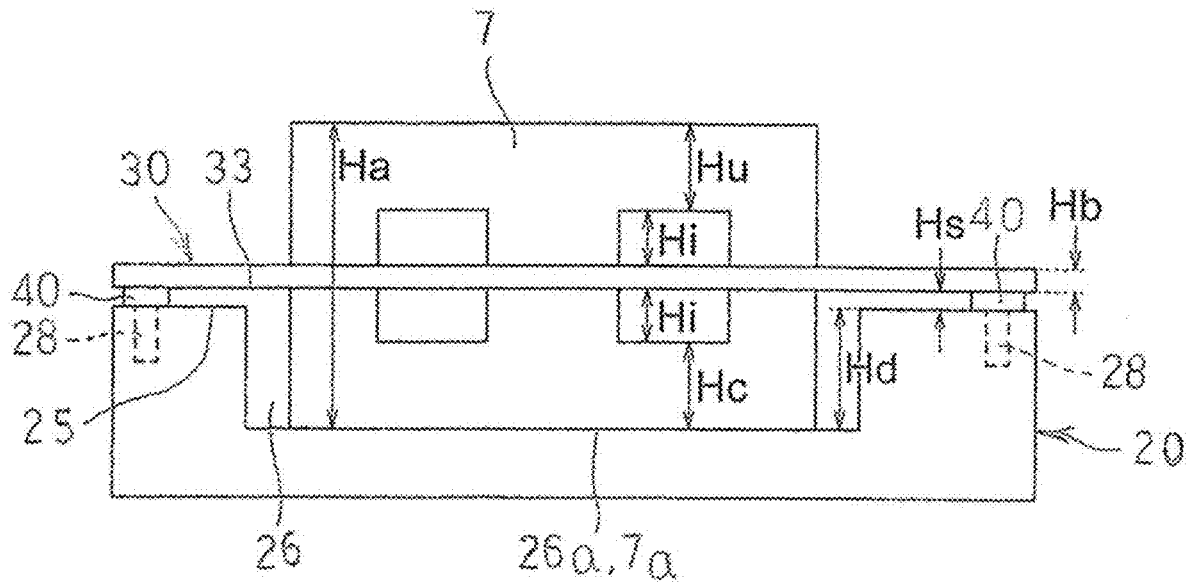
FIG. 5 is a sectional view of main components around cores in the electric power converter according to the first embodiment of the present invention.

Referring to FIG. 5, description is next given of an insulation distance between the substrate 30 and each core 7 of the smoothing reactor 5 and the transformer 3. FIG. 5 is a sectional view of main components around the cores in the electric power converter according to the first embodiment of the present invention.

A recess 26 is formed in the substrate fixing surface 25 of the heat radiating plate 20. The recess 26 has a depth Hd of, for example, 7 mm. The cores 7 of the smoothing reactor 5 and the transformer 3 are mounted to the substrate 30 so as to pass through the core-specific opening 32. Each core 7 has a bottom surface 7a in contact with a bottom surface 26a of the recess 26. Here, the depth Hd satisfies the following expressions.

$$Hd > Hi - Hs + Hc \text{ and } Hd < Ha - Hu - Hs - Hb - Hi$$

where

Hi represents a required insulation distance between a metal pattern formed on the substrate 30 and each core 7, Hs represents a height of the spacer 40, Hc represents a thickness of each core 7 on the bottom surface 26a side of the recess 26, Hd represents a depth of the recess 26, Ha represents a height of each core 7, Hu represents a thickness of each core 7 on an opposite side to the bottom surface 26a of the recess 26, and Hb represents a thickness of the substrate 30.

For example, when Hi=3 mm, Hs=1 mm, Hc=Hu=3.5 mm, Hb=1.6 mm, and Ha=18 mm are given, the depth Hd is from 6 mm to 8.4 mm.

The recess 26 formed in the heat radiating plate 20 may be subjected to potting. Further, the heat radiating sheet or heat radiating grease having high heat conductivity, for example, may be placed between the bottom surface 7a of each core 7 and the bottom surface 26a of the recess 26.

Figure 7:
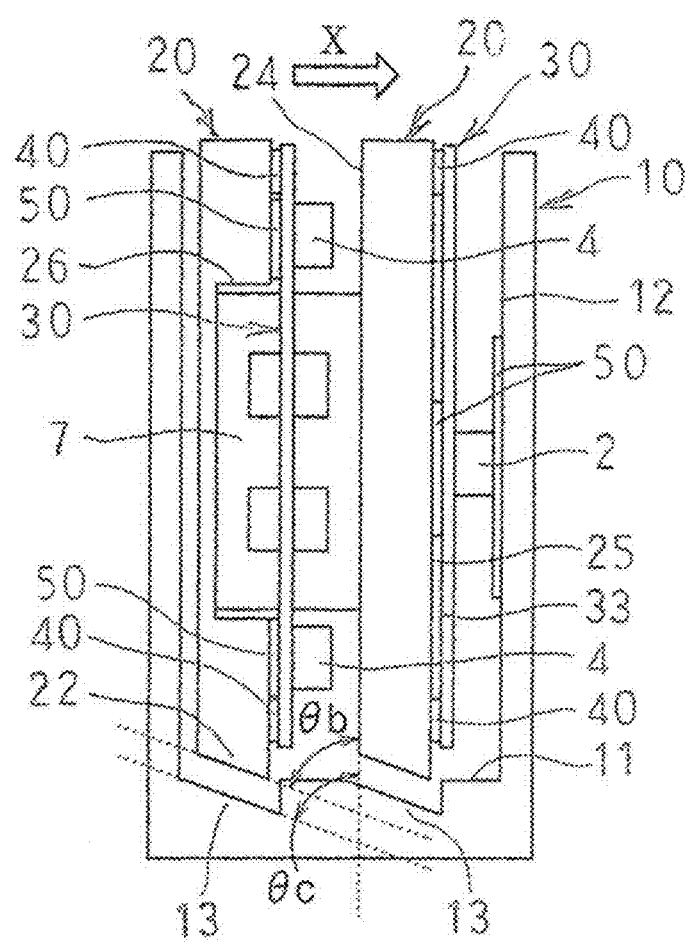
FIG. 7 is a sectional view for illustrating the structure of the heat radiating plate in the electric power converter according to the first embodiment of the present invention.

Referring to FIG. 6 and FIG. 7, description is next given of the structure of the heat radiating plate 20. FIG. 6 is a perspective view of main components for illustrating the structure of the heat radiating plate in the electric power converter according to the first embodiment of the present invention. FIG. 7 is a sectional view for illustrating the structure of the heat radiating plate in the electric power converter according to the first embodiment of the present invention. In FIG. 6, only bottom portions of the heat radiating plate and the casing are illustrated.

The heat radiating plate 20 has the second tapered portion 22 at its surface on the side of the main cooling surface 11 of the casing 10. The second tapered portion 22 has the structure in which the thickness of the heat radiating plate 20 becomes thinner toward the main cooling surface 11 of the casing 10. The component contact surface 24 of the other heat radiating plate 20 facing the substrate fixing surface 25 of the heat radiating plate 20 and the second tapered portion 22 of the heat radiating plate 20 form an angle θb of, for example, 70°.

The main cooling surface 11 of the casing 10 has the first tapered portion 13 having a recess shape. The first tapered portion 13 formed in the main cooling surface 11 has such a recess shape that a width Wt of the first tapered portion 13 is reduced in the depth direction of the recess shape, and which extends in a direction orthogonal to the X direction. The width Wt of the first tapered portion 13 is, for example, 12 mm at the widest portion. The first tapered portion 13 has a depth of, for example, 4 mm. Further, the first tapered portion 13 has a length Lt equal to an inner width of the casing 10. The first tapered portion 13 formed in the main cooling surface 11 and the component contact surface 24 of the heat radiating plate 20 form an angle θc equal to the angle θb. In this example, the first tapered portion 13 of the casing 10 is formed in the entire region in the width direction of the main cooling surface 11.

When the heat radiating plate 20 having the substrate 30 fixed thereto is inserted into the casing 10 perpendicularly to the main cooling surface 11, the second tapered portion 22 of the heat radiating plate 20 is brought into contact with the first tapered portion 13 of the casing 10. The heat radiating plate 20 is slid to move along the first tapered portion 13 while the second tapered portion 22 of the heat radiating plate 20 is in contact with the first tapered portion 13 of the casing 10. At this time, the heat radiating plate 20 having the substrate 30 fixed thereto to which the MOSFETs 2 are mounted is slid to move in the X direction along the first tapered portion 13 to which the second tapered portion 22 is to be connected, and the MOSFETs 2 are brought into contact with the component contact surface 12 of the casing 10 through intermediation of the heat radiating sheet 50. Further, the heat radiating plate 20 having the substrate 30 fixed thereto to which the cores 7 are mounted is slid to move in the X direction along the first tapered portion 13 to which the second tapered portion 22 is to be connected, and the cores 7 are brought into contact with the component contact surface 24 of the heat radiating plate 20. As a result, the two heat radiating plates 20 each having the substrate 30 fixed thereto are accommodated in the casing 10 while being arranged in a row in the X direction in such a posture that each substrate 30 is orthogonal to the X direction. The substrate fixing surface 25 and the component contact surface 24 of the adjacent heat radiating plates 20 are opposite to each other. In this example, the heat radiating plate 20 having the substrate 30 fixed thereto to which the MOSFETs 2 are mounted is a heat radiating plate at the head in the arrangement direction of the heat radiating plates 20. Further, the heat radiating plate 20 having the substrate 30 fixed thereto to which the cores 7 are mounted is the remaining heat radiating plate.

The MOSFET 2 is brought into contact with the component contact surface 12 of the casing 10 through intermediation of the heat radiating sheet 50, but when the casing 10 is not required to be electrically isolated, the MOSFET 2 may be brought into direct contact with the component contact surface 12. Further, the cores 7 are brought into direct contact with the component contact surface 24 of the heat radiating plate 20, but when it is required to enhance thermal contact with the component contact surface 24 of the heat radiating plate 20, the cores 7 may be brought into contact with the component contact surface 24 through intermediation of the heat radiating sheet 50.

Figure 8:
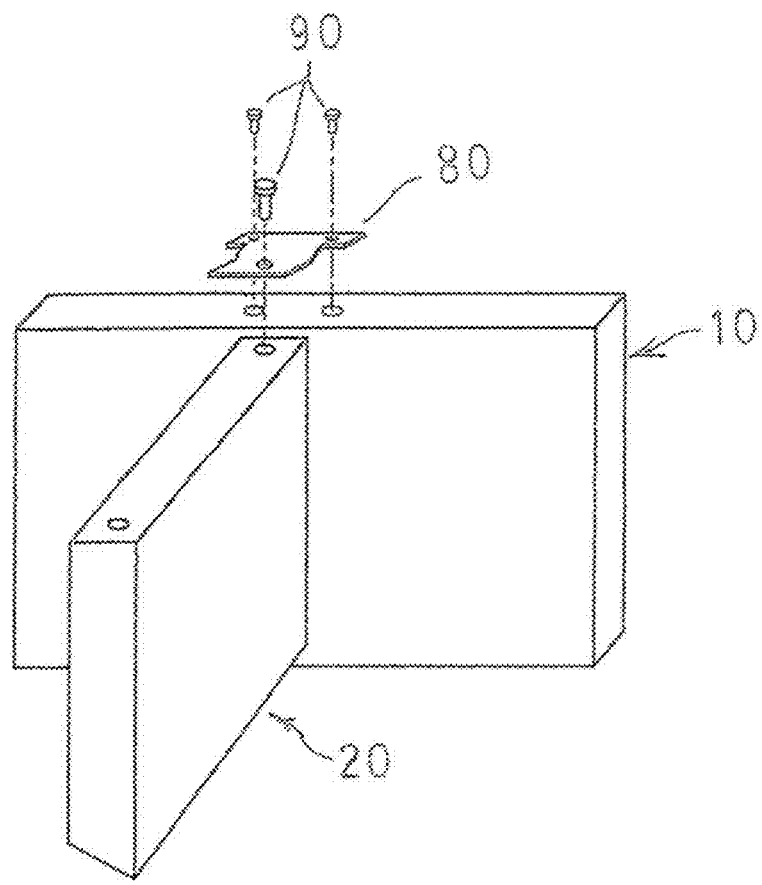
FIG. 8 is a view for illustrating a fixing method for the heat radiating plate in the electric power converter according to the first embodiment of the present invention.
Figure 9:
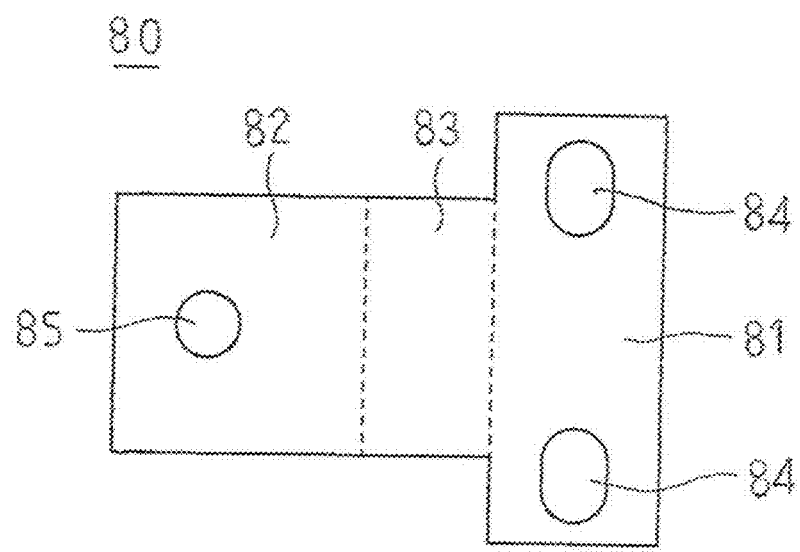
FIG. 9 is a plan view of a fixing metal fitting to be used for fixing the heat radiating plate in the electric power converter according to the first embodiment of the present invention.
Figure 10:
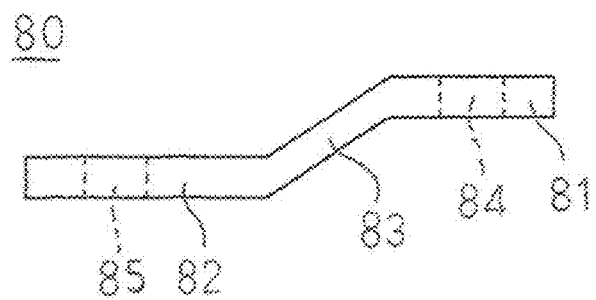
FIG. 10 is a side view of the fixing metal fitting to be used for fixing the heat radiating plate in the electric power converter according to the first embodiment of the present invention.

Referring to FIG. 8 to FIG. 10, a fixing method for the heat radiating plate 20 is described. FIG. 8 is a view for illustrating the fixing method for the heat radiating plate in the electric power converter according to the first embodiment of the present invention. FIG. 9 is a plan view of a fixing metal fitting to be used for fixing the heat radiating plate in the electric power converter according to the first embodiment of the present invention. FIG. 10 is a side view of the fixing metal fitting to be used for fixing the heat radiating plate in the electric power converter according to the first embodiment of the present invention.

A fixing metal fitting 80 includes a casing mounting portion 81, a heat radiating plate mounting portion 82, and a coupling portion 83 for coupling the casing mounting portion 81 and the heat radiating plate mounting portion 82. The fixing metal fitting 80 is formed into a T shape in which the heat radiating plate mounting portion 82 and the coupling portion 83 are orthogonal to the casing mounting portion 81 as viewed from a direction orthogonal to an upper surface. Further, the fixing metal fitting 80 is formed into a crank shape in which the heat radiating plate mounting portion 82 is shifted downward with respect to the casing mounting portion 81 as viewed from a direction orthogonal to a side surface. This structure absorbs a height difference between the casing 10 and the heat radiating plate 20. The casing mounting portion 81 has two elongated holes 84. The heat radiating plate mounting portion 82 has one screw hole 85. The heat radiating plate mounting portion 82 is fixed to the heat radiating plate 20 by fastening a screw 90 to the heat radiating plate 20 through the screw hole 85. Further, the casing mounting portion 81 is fixed to the casing 10 by fastening the screws 90 to the casing 10 through the elongated holes 84. In this manner, the heat radiating plate 20 is fixed on both sides to the casing 10 through use of the fixing metal fitting 80.

Figure 11:
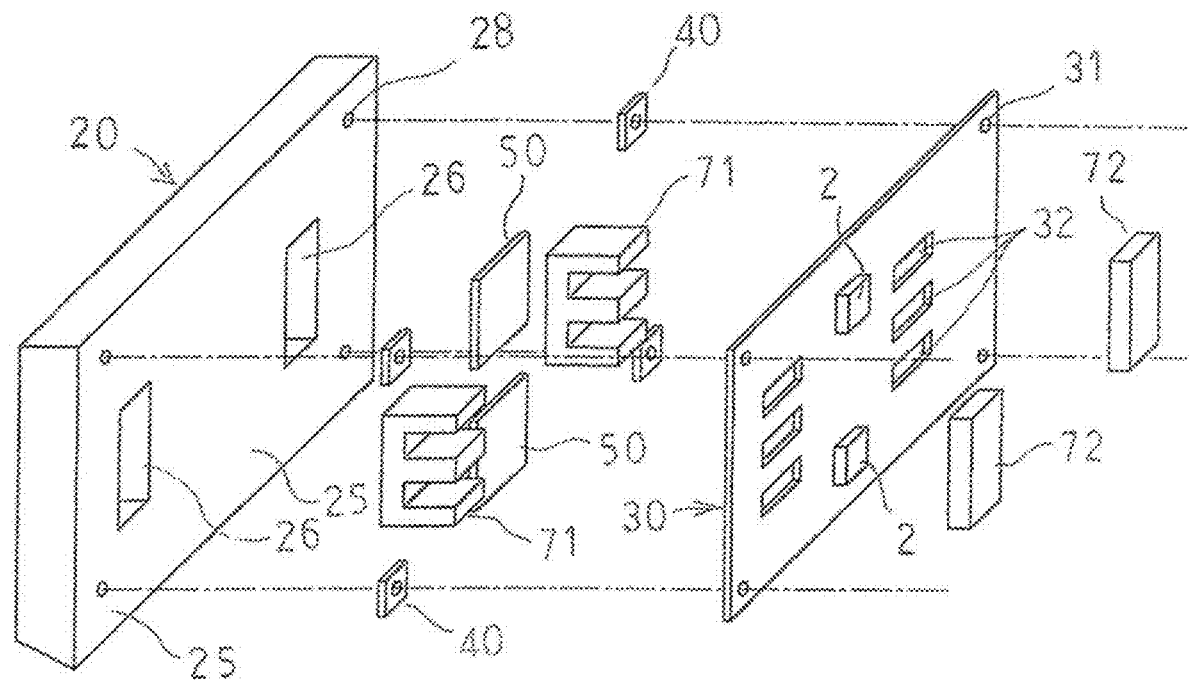
FIG. 11 is a view for illustrating an assembly method for the electric power converter according to the first embodiment of the present invention.

Next, description is given of an assembly method for the thus-configured electric power converter 100. FIG. 11 is a view for illustrating the assembly method for the electric power converter according to the first embodiment of the present invention.

First, on the substrate 30, the heat generating components such as the power semiconductor, for example, the MOSFET 2 and the diode 4, the cores 7 of the smoothing reactor 5 and the transformer 3, or other electric components are mounted. In this example, the power semiconductor, for example, the MOSFET 2 and the diode 4 are surface-mounted components, but through-hole parts can be used instead. Further, most of the components are soldered to the wiring pattern on the substrate 30, but joining means is not limited to soldering as long as electrical connection is ensured.

As illustrated in FIG. 11, the cores 7 of the smoothing reactor 5 and the transformer 3 are configured by combining, for example, E-type cores 71 and I-type cores 72. Each E-type core 71 includes a plurality of legs. Further, in the substrate 30, the core-specific openings 32 are formed, which have a sectional area equal to or larger than each leg and correspond to the legs of the E-type core 71. Then, each leg of the E-type core 71 is inserted to a corresponding one of the core-specific openings 32, and the I-type cores 72 are fixed to the legs sticking out of the core-specific openings 32 with the use of an adhesive or the like. With this, the cores 7 are mounted to the substrate 30.

Next, the substrate 30 having the heat generating components and the electric components mounted thereto is fixed to the substrate fixing surface 25 of the heat radiating plate 20 with the use of screws or the like. At this time, as for one substrate 30, each heat radiating sheet 50 is sandwiched between the substrate fixing surface 25 of the heat radiating plate 20 and the substrate surface 33 on an opposite side to a region of the substrate 30 to which the diode 4 is mounted. As for the other substrate 30, the heat radiating sheet 50 is sandwiched between the substrate fixing surface 25 of the heat radiating plate 20 and the substrate surface 33 on an opposite side to a region of the substrate 30 to which the MOSFETs 2 are mounted. With this structure, the MOSFETs 2 are brought into contact with the substrate fixing surface 25 of the heat radiating plate 20 through intermediation of the substrate 30 and the heat radiating sheet 50. Further, the diode 4 is brought into contact with the substrate fixing surface 25 of the heat radiating plate 20 through intermediation of the substrate 30 and the heat radiating sheet 50.

Next, the two heat radiating plates 20 each having a corresponding substrate 30 fixed thereto are inserted into the casing 10 perpendicularly to the main cooling surface 11. At this time, one heat radiating plate 20 of the two heat radiating plates 20, which is located on a fore side in the X direction, is first inserted into the casing 10. The fore side in the X direction refers to a right side in FIG. 4. The two heat radiating plates 20 are slid to move forward in the X direction while the second tapered portion 22 is in contact with the first tapered portion 13 of the casing 10. With this structure, the MOSFET 2 is brought into contact with the component contact surface 12 of the casing 10 through intermediation of the heat radiating sheet 50. A surface of the core 7 on the fore side in the X direction is brought into direct contact with the component contact surface 24 of the heat radiating plate 20 to which the substrate 30 having the MOSFET 2 mounted thereto is fixed. Further, the bottom surface 7a of the core 7 located on a rear side in the X direction is brought into direct contact with the bottom surface 26a of the recess 26 of the heat radiating plate 20.

Next, the heat radiating plates 20 are each fixed to the casing 10 through use of the fixing metal fitting 80. After that, inputs and outputs of the two substrates 30 are electrically connected through use of wirings (not shown). With this, the electric power converter 100 is assembled.

Prior to a step of inserting the heat radiating plates 20 each having a corresponding substrate 30 fixed thereto into the casing 10, a potting material may be poured into the casing 10 and after the heat radiating plates 20 are inserted into the casing 10, the potting material may be cured.

Next, effects of the first embodiment are described.

The MOSFET 2 mounted to the substrate 30 is brought into contact with the component contact surface 12 of the casing 10 through intermediation of the heat radiating sheet 50. Further, the MOSFET 2 is brought into contact with the substrate fixing surface 25 of the heat radiating plate 20 through intermediation of the substrate surface 33 and the heat radiating sheet 50 on an opposite side to the substrate 30. Thus, heat generated in the MOSFET 2 being the heat generating component is radiated toward the cooling device 9 via the casing 10 through two paths, specifically, the substrate fixing surface 25 of the heat radiating plate 20 having the substrate 30 fixed thereto and the component contact surface 12 of the casing 10.

The diode 4 mounted to the substrate 30 is brought into contact with the substrate fixing surface 25 of the heat radiating plate 20 through intermediation of the heat radiating sheet 50. Thus, heat generated in the diode 4 being the heat generating component is radiated toward the cooling device 9 via the casing 10 through a path of the substrate fixing surface 25 of the heat radiating plate 20 having the substrate 30 fixed thereto.

The cores 7 mounted to the substrate 30 are brought into contact with the bottom surface 26a of the recess 26 in the heat radiating plate 20 having the substrate 30 fixed thereto to which the cores 7 are mounted and the component contact surface 24 of the other heat radiating plate 20. Thus, heat generated in the cores 7 being the heat generating components is radiated toward the cooling device 9 via the casing 10 through two paths, specifically, the substrate fixing surface 25 of the heat radiating plate 20 having the substrate 30 fixed thereto to which the cores 7 are mounted and the component contact surface 24 of the other heat radiating plate 20.

As described above, the heat generated in the heat generating components including the MOSFETs 2 and the cores 7 is radiated from the cooling device 9 through two paths. With this structure, even when there is a long distance from the heat generating component to the cooling device 9, a heat resistance from the heat generating component to the cooling device 9 can be reduced, thereby suppressing a temperature rise in the heat generating component. Thus, it is possible to perform efficient cooling only with a contact area between the main cooling surface and the heat radiating plate 20. With this structure, a temperature rise in the heat generating component can be suppressed without increasing an area of the main cooling surface 11, and hence a compact electric power converter 100 can be provided.

The casing 10 has the first tapered portion 13 along which the second tapered portion 22 of each heat radiating plate 20 is slid to move forward in the X direction. The heat radiating plate 20 located on the fore side in the X direction is thus slid to move toward the component contact surface 12 of the casing 10. The heat radiating plate 20 located on the rear side in the X direction is slid to move toward the component contact surface 24 of the heat radiating plate 20 located on the fore side in the X direction. With this structure, the MOSFETs 2 being the heat generating components, which are mounted to the substrate 30 fixed to the heat radiating plate 20 located on the fore side in the X direction are easily and reliably brought into contact with the component contact surface 12 of the casing 10 through intermediation of the heat radiating sheet 50. The cores 7 being the heat generating components mounted to the substrate 30 fixed to the heat radiating plate 20 located on the rear side in the X direction are easily and reliably brought into contact with the component contact surface 24 of the heat radiating plate 20 located on the fore side in the X direction. Further, when the heat radiating plate 20 located on the rear side in the X direction is slid to move, the heat radiating plate 20 located on the fore side in the X direction is pushed forward in the X direction, and hence the heat radiating sheet 50 sandwiched between each MOSFET 2 and the component contact surface 12 of the casing 10 deforms into a shape conforming to the surface of each MOSFET 2. Consequently, a contact area between each MOSFET 2 and the component contact surface 12 of the casing 10 which are brought into contact through intermediation of the heat radiating sheet 50, is increased.

Further, the second tapered portion 22 of the heat radiating plate 20 and the first tapered portion 13 of the casing 10 are brought into contact with each other, and thus as compared to such a case that a heat radiating plate and a casing, both of which have no tapered portion, are brought into contact with each other, a contact area between the heat radiating plate 20 and the casing 10 can be increased. With this structure, a heat resistance from the heat generating component to the cooling device 9 can be reduced. Thus, it is possible to suppress a temperature rise not only in the MOSFETs 2 and the cores 7 but also in the diodes 4 having only one heat radiating system. That is, a temperature rise in all the heat generating components can be suppressed.

Further, each core 7 is brought into contact, at its flat surface, with the component contact surface 24 of the heat radiating plate 20, and hence a contact area between each core 7 and the component contact surface 24 is increased. With this structure, heat generated in each core 7 is efficiently transferred to a corresponding heat radiating plate 20. The surface of each core 7 that is brought into contact with the component contact surface 24 of the heat radiating plate 20 is only required to be a flat surface, and for example, an EI-type, EE-type, EER-type, or PQ-type core can be used.

Further, the cores 7 of the transformer 3 and the smoothing reactor 5 are brought into contact with the bottom surface 26a of the recess 26 formed in the substrate fixing surface 25 of the heat radiating plate 20 and the component contact surface 24 of the other heat radiating plate 20. With this structure, a distance between the core 7 and the substrate 30 is secured without fixing the cores 7 of the transformer 3 and the smoothing reactor 5 to the substrate 30. Therefore, any member for fixing the cores 7 of the transformer 3 and the smoothing reactor 5 is not required, and the electric power converter 100 is downsized.

Figure 12:
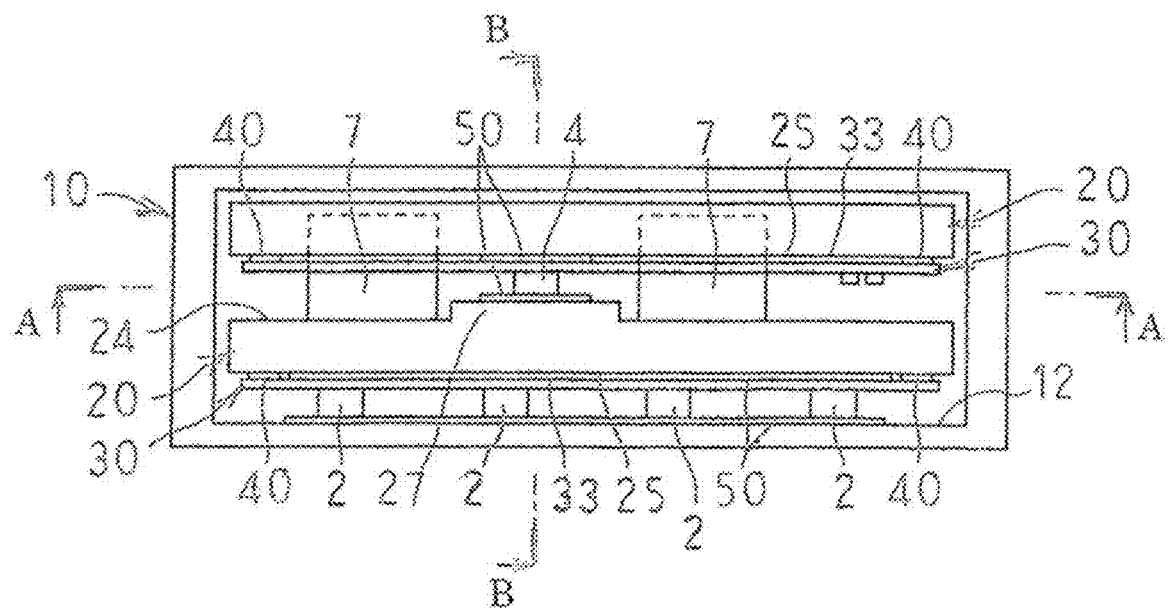
FIG. 12 is a top view of a first modification example of the electric power converter according to the first embodiment of the present invention.
Figure 13:
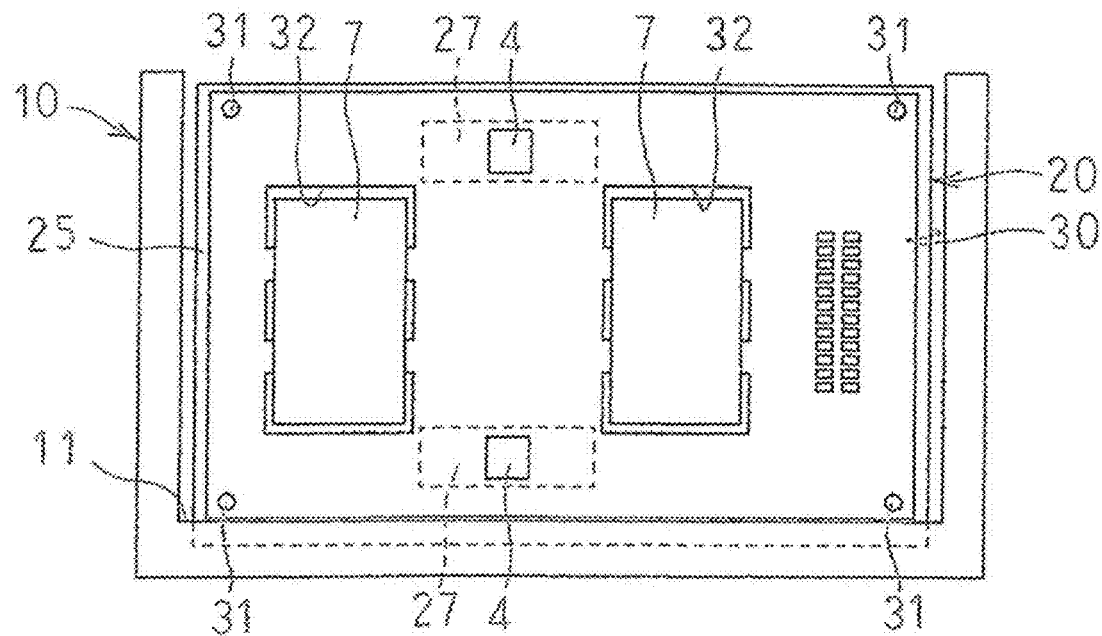
FIG. 13 is a sectional view taken along the arrow line A-A of FIG. 12.
Figure 14:
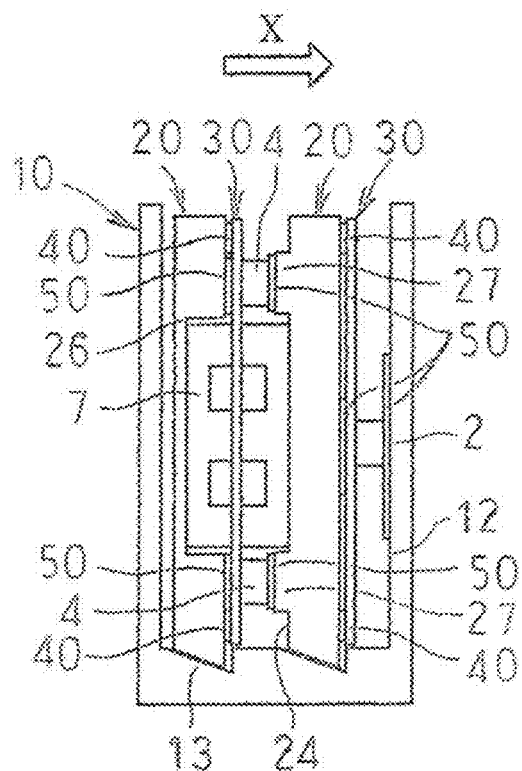
FIG. 14 is a sectional view taken along the arrow line B-B of FIG. 12.

In some cases, heights from a surface of the substrate 30 facing the component contact surface 24 of the heat radiating plate 20 to a plurality of heat generating components are different. In the first embodiment, each diode 4 and each core 7 protrude from the substrate 30 with different heights. Thus, each core 7 is brought into contact with the component contact surface 24 of the heat radiating plate 20. Meanwhile, each diode 4 is not brought into contact with the component contact surface 24 of the heat radiating plate 20. In this case, as illustrated in FIG. 12 to FIG. 14, on the component contact surface 24 of the heat radiating plate 20, a metal block 27 may be provided in accordance with the height of each heat generating component. With this structure, each diode 4 having a smaller height can be brought into contact with the metal block 27 through intermediation of the heat radiating sheet 50. As a result, heat radiation paths of two systems can be provided for all the heat generating components. In this example, the metal block 27 is produced at the time of production of the heat radiating plate 20, that is, produced from the same part as that of the heat radiating plate 20. However, the metal block 27 may be produced from a different member from that of the heat radiating plate 20, and then fixed to the component contact surface 24 with screws or the like.

Figure 15:
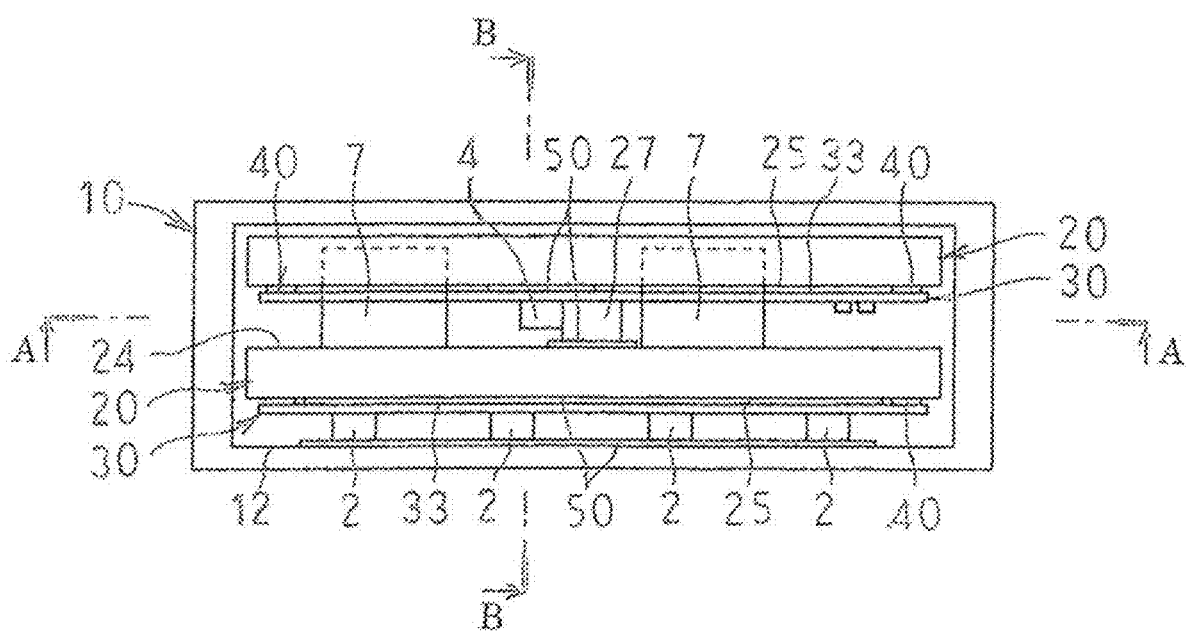
FIG. 15 is a top view of a second modification example of the electric power converter according to the first embodiment of the present invention.
Figure 16:
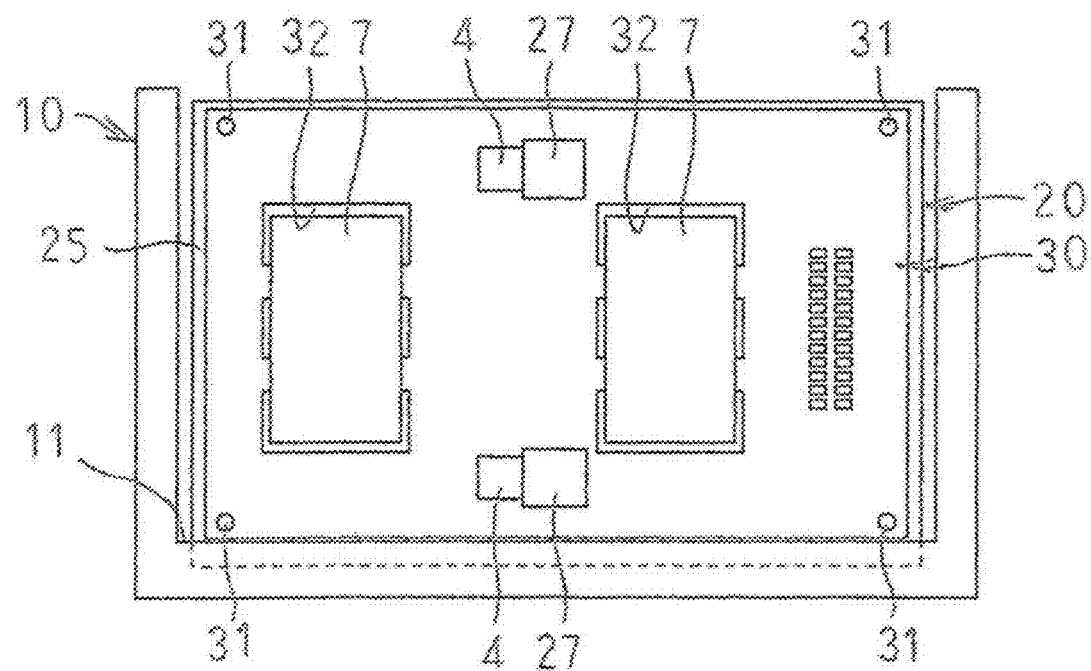
FIG. 16 is a sectional view taken along the arrow line A-A of FIG. 15.
Figure 17:
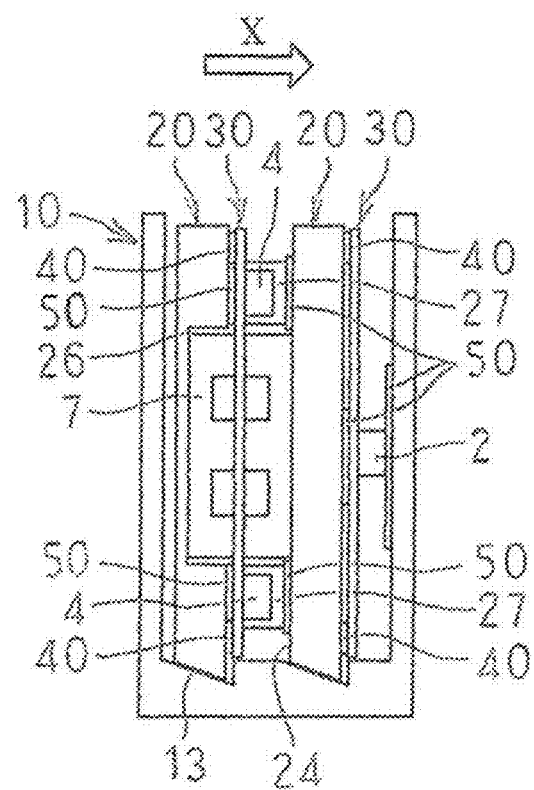
FIG. 17 is a sectional view taken along the arrow line B-B of FIG. 15.

As illustrated in FIG. 15 to FIG. 17, the metal block 27 may be produced from a different member from that of the heat radiating plate 20 and then mounted in the vicinity of each diode 4 being a short heat generating component or in contact with each diode 4 of the substrate 30. In this case, it is assumed that the height of the metal block 27 is the same as the height of each core 7 being a tall heat generating component, or the total thickness of the metal block 27 and the heat radiating sheet 50 is the same as the height of each core 7. The metal block 27 may be soldered to a wiring pattern on the substrate 30 or fixed thereto with screws. Further, when the metal block 27 is fixed to the wiring pattern having the same potential as that of each diode 4, generated heat can be efficiently transferred from each diode 4 to the heat radiating plate 20. Moreover, the heat generating components of the same height may be mounted to each substrate 30. With the heat generating components of the same height being provided on each substrate 30, even when the component contact surface 24 of the heat radiating plate 20 is a flat surface, all the heat generating components can be brought into contact with the heat radiating plate 20. In this case, the component contact surface 24 of the heat radiating plate 20 can be a flat surface, and hence the heat radiating plate 20 can be easily processed.

Figure 18:
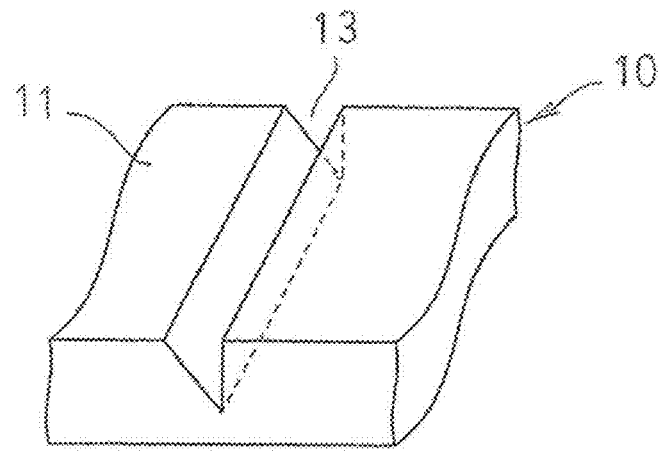
FIG. 18 is a perspective view of a first tapered portion in the electric power converter according to the first embodiment of the present invention.
Figure 19:
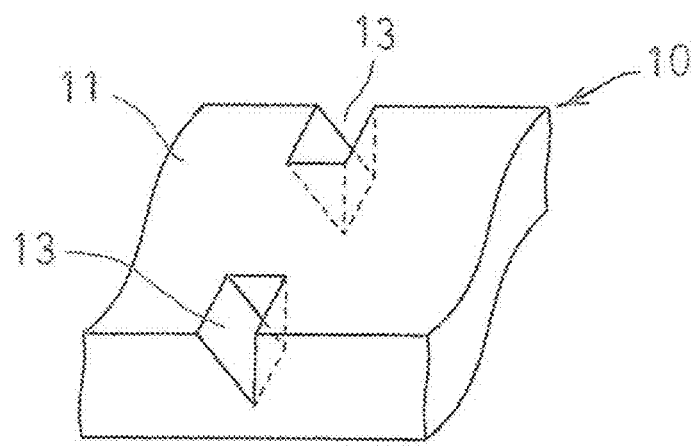
FIG. 19 is a perspective view of a first modification example of the first tapered portion in the electric power converter according to the first embodiment of the present invention.
Figure 20:
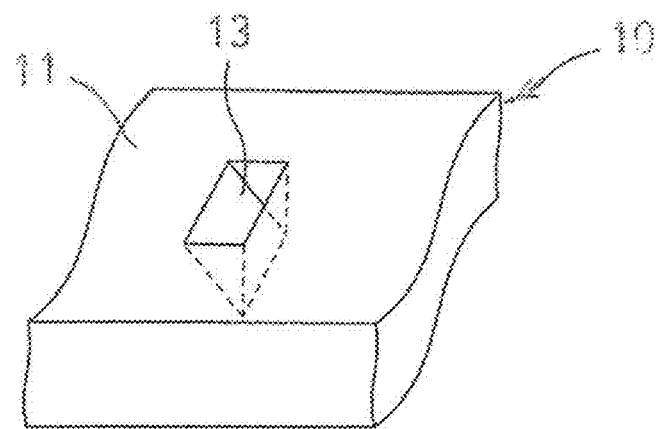
FIG. 20 is a perspective view of a second modification example of the first tapered portion in the electric power converter according to the first embodiment of the present invention.

Next, a shape of the first tapered portion 13 formed in the main cooling surface 11 of the casing 10 is described. As illustrated in FIG. 18, the first tapered portion 13 may be formed to extend from one side to the other side in a width direction of the main cooling surface 11 orthogonal to the X direction being a sliding direction. Further, as illustrated in FIG. 19, the first tapered portion 13 may be formed to be divided on both sides in the width direction of the main cooling surface 11. Moreover, as illustrated in FIG. 20, the first tapered portion 13 may be formed at a center position in the width direction of the main cooling surface 11. As described above, as long as the first tapered portion 13 allows the heat radiating plate 20 to be slid to move in the X direction, the first tapered portion 13 may be formed at any position. In this case, the second tapered portion 22 formed in the heat radiating plate 20 is appropriately set in accordance with the shape and position of the first tapered portion 13 of the casing 10 so as to be slidably fitted to the first tapered portion 13 of the casing 10.

Figure 21:
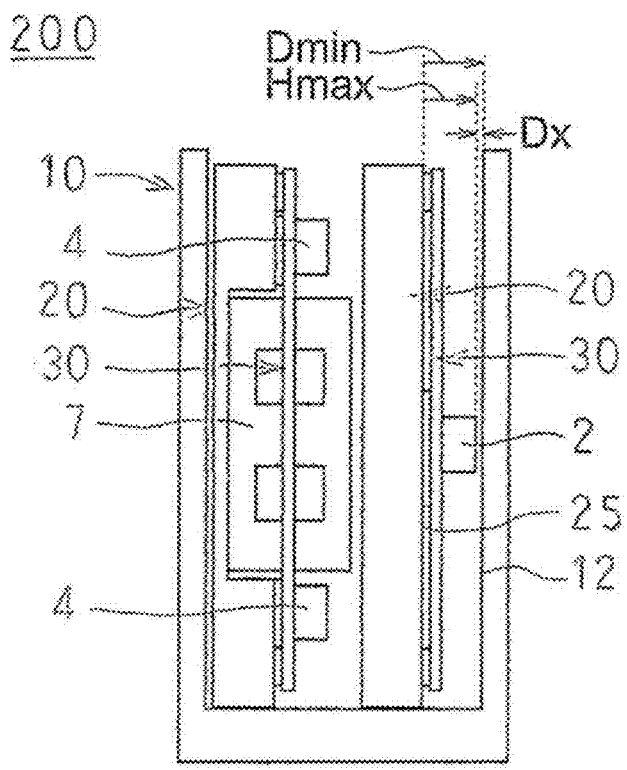
FIG. 21 is a sectional view of an electric power converter of a comparative example.

Referring to FIG. 21, description is given of a case in which the main cooling surface 11 of the casing 10 has no first tapered portion 13. FIG. 21 is a sectional view of an electric power converter of a comparative example.

When the heat radiating plate 20 having the substrate 30 mounted thereto is inserted into the casing 10, there are dimensional errors among the heat generating components, the heat radiating plate 20, and the casing 10. Thus, it is required that a minimum dimension Dmin of a distance D between the substrate fixing surface 25 of the heat radiating plate 20 and the component contact surface 12 of the casing 10 be larger than a maximum dimension Hmax of a height from the substrate fixing surface 25 of the heat radiating plate 20 to the MOSFET 2 being the tallest heat generating component.

In an electric power converter 200 of the comparative example, the main cooling surface 11 of the casing 10 is formed into a planar surface and has no first tapered portion 13. A side surface of the heat radiating plate 20 in contact with the main cooling surface 11 is a planar surface. That is, in the electric power converter 200 of the comparative example, there is no tapered portion at a contact portion between the main cooling surface 11 of the casing 10 and the heat radiating plate 20. Thus, when the heat radiating plate 20 is inserted into the casing 10, the heat radiating plate 20 is not slid to move. Thus, as illustrated in FIG. 21, a gap Dx is always defined between the MOSFET 2 being the heat generating component and the component contact surface 12 of the casing 10. When the gap Dx is defined between the heat generating component and the component contact surface 12 of the casing 10, thermal connection does not occur, and hence a temperature rise in the heat generating component is not suppressed. The gap Dx satisfies Dx=Dmin−Hmax.

In the electric power converter 100 of the first embodiment, the first tapered portion 13 is formed in the main cooling surface 11 of the casing 10, and the second tapered portion 22 is formed in a side surface of the heat radiating plate 20. Thus, when the heat radiating plate 20 is inserted into the casing 10, the heat radiating plate 20 is slid to move in the X direction. As a result, the MOSFET 2 being the heat generating component is brought into contact with the component contact surface 12 of the casing 10, and thus a temperature rise in the MOSFET 2 is suppressed.

In the electric power converter 100 of the first embodiment, the two substrates 30 are used. At this time, it is preferred that the plurality of heat generating components mounted to each substrate 30 have the same height. When the plurality of heat generating components have the same height, it is not required to provide the metal block 27 in accordance with the heights of the heat generating components. However, when the substrate 30 is prepared for every different height of the plurality of heat generating components, the number of substrates 30 increases. Consequently, the circuit of the electric power converter 100 illustrated in FIG. 1 is divided, and more connection portions are disadvantageously required.

Figure 22:
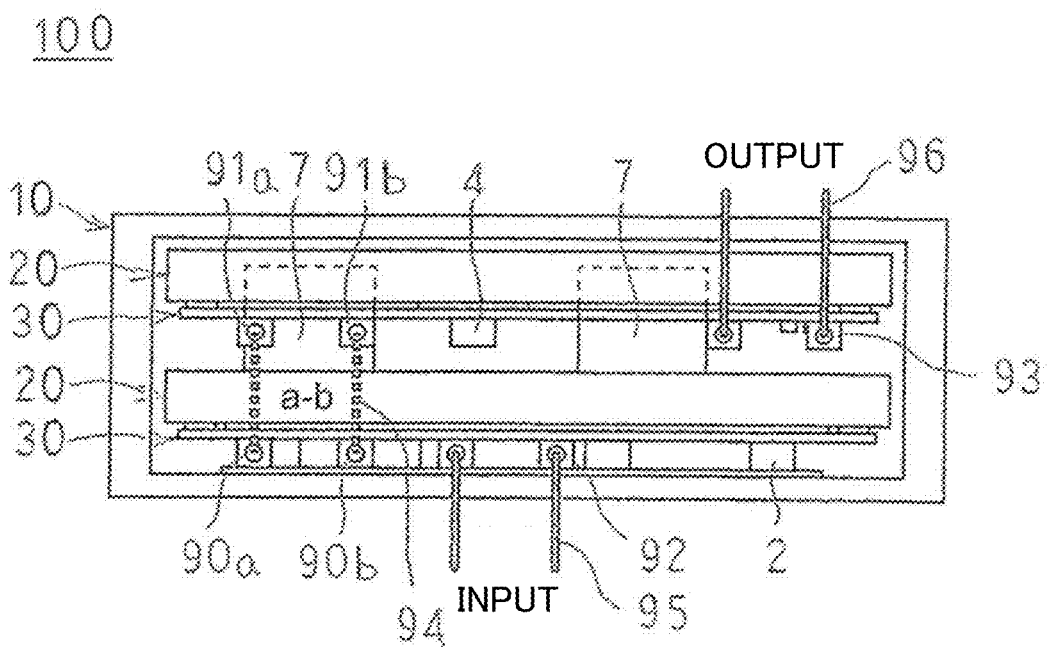
FIG. 22 is a top view for illustrating a connection structure in the electric power converter according to the first embodiment of the present invention.
Figure 23:
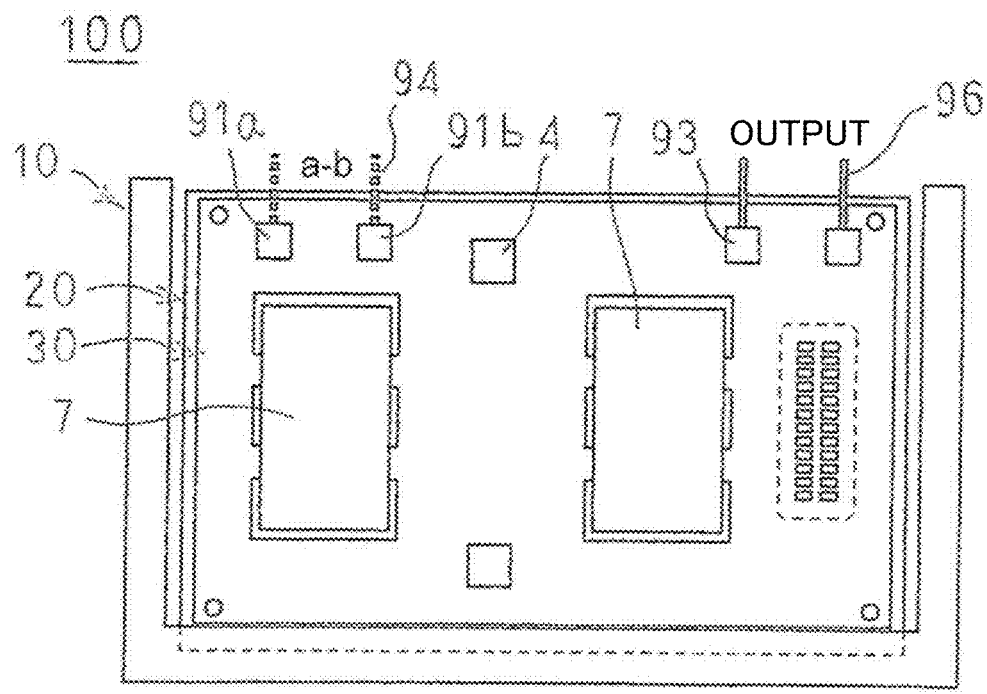
FIG. 23 is a sectional view for illustrating the connection structure in the electric power converter according to the first embodiment of the present invention.
Figure 24:
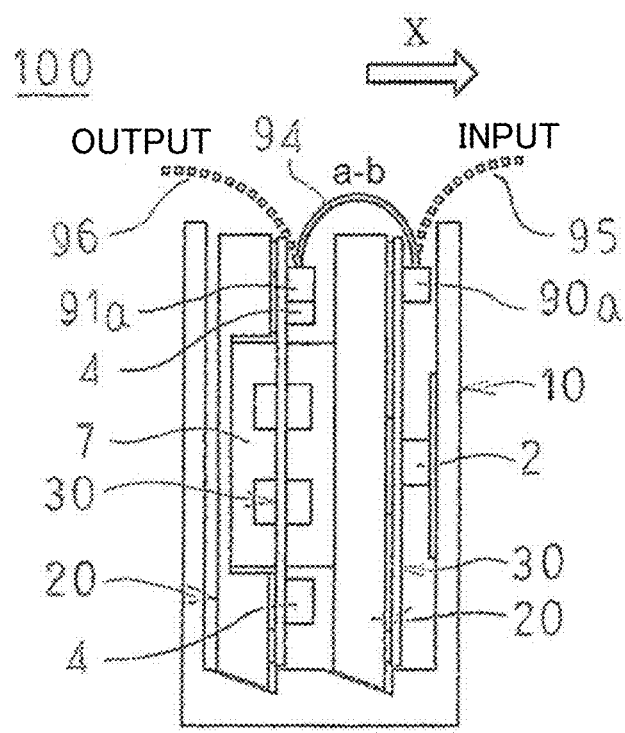
FIG. 24 is a sectional view for illustrating the connection structure in the electric power converter according to the first embodiment of the present invention.

In the electric power converter 100 of the first embodiment, as illustrated in FIG. 22 to FIG. 24, the four MOSFETs 2 are mounted on one substrate 30, and the transformer 3, the two diodes 4, the smoothing reactor 5, and the smoothing capacitor 6 are mounted on the other substrate 30. The one substrate 30 has connection terminals 90a and 90b respectively connected to points "a" and "b" illustrated in FIG. 1, and input terminals 92. The other substrate 30 has connection terminals 91a and 91b connected to primary side input terminals of the transformer 3, and output terminals 93. Connection lines 94 connect between the connection terminals 90a and 91a and between the connection terminals 90b and 91b. Further, input lines 95 are connected to the input terminals 92, and output lines 96 are connected to the output terminals 93. As described above, according to the first embodiment, it is possible to set the three connection portions, specifically, the input, the point "a"-point "b", and the output.

Second Embodiment

Figure 25:
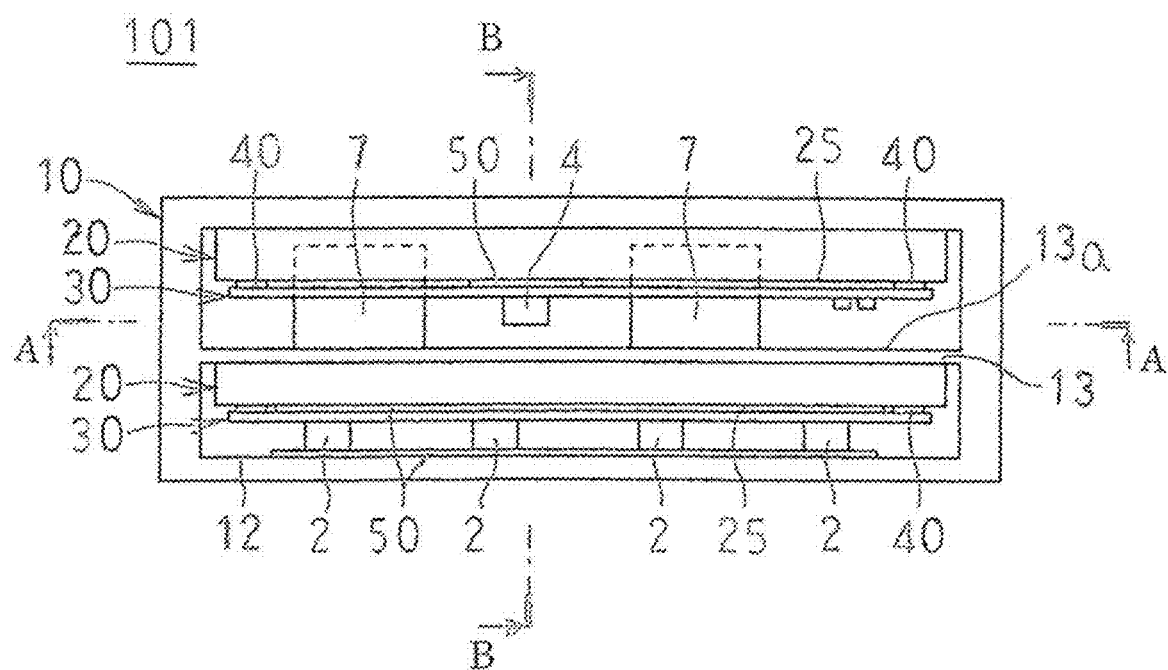
FIG. 25 is a top view of an electric power converter according to a second embodiment of the present invention.
Figure 26:
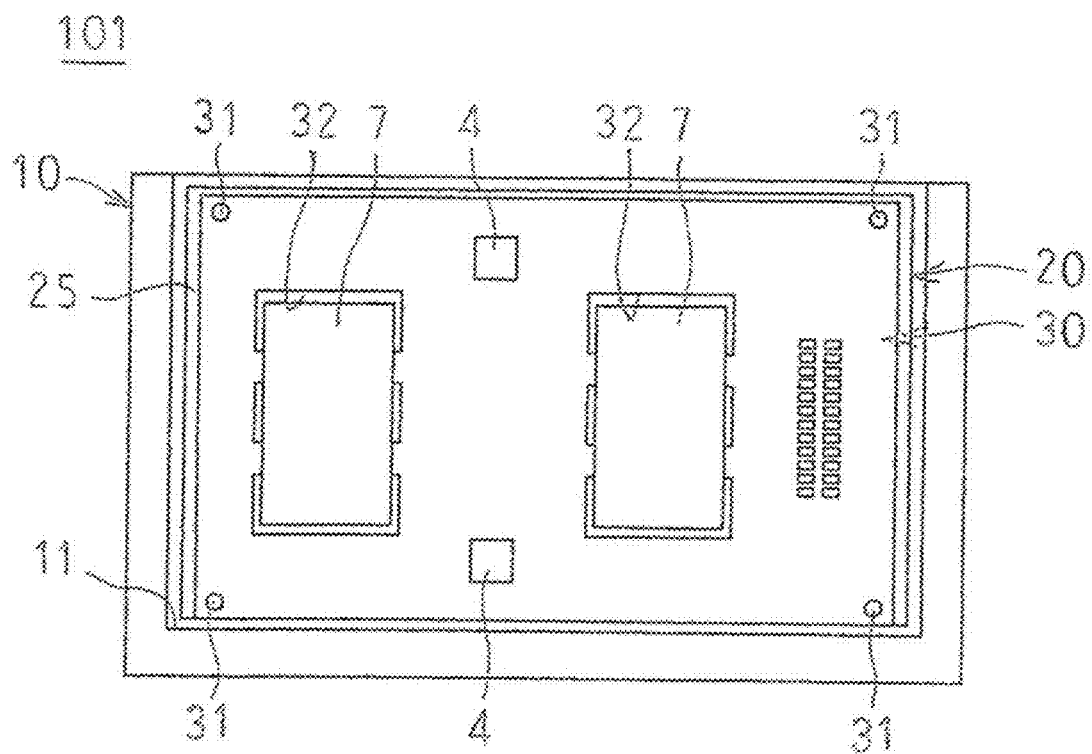
FIG. 26 is a sectional view taken along the arrow line A-A of FIG. 25.
Figure 27:
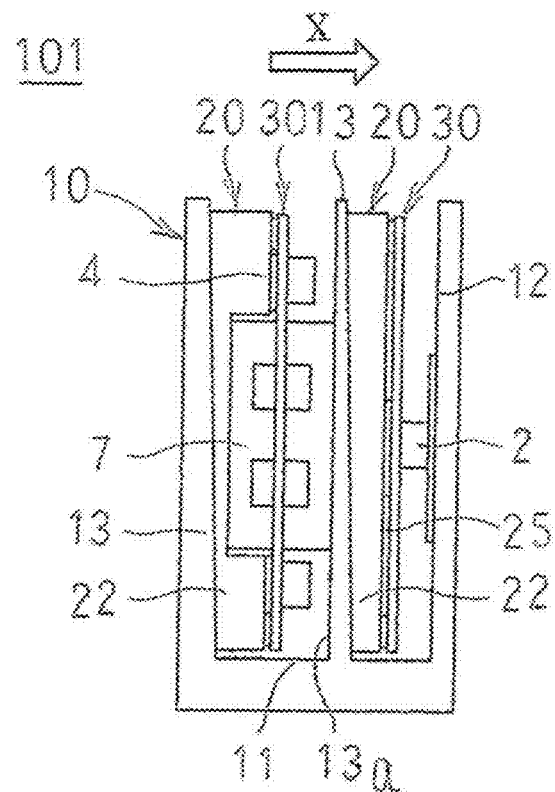
FIG. 27 is a sectional view taken along the arrow line B-B of FIG. 25.

FIG. 25 is a top view of an electric power converter according to a second embodiment of the present invention. FIG. 26 is a sectional view taken along the arrow line A-A of FIG. 25. FIG. 27 is a sectional view taken along the arrow line B-B of FIG. 25.

In FIG. 25 to FIG. 27, the first tapered portion 13 is formed so as to protrude from the main cooling surface 11 of the casing 10 in the height direction while being opposite to the component contact surface 12 of the casing 10 located on the fore side in the X direction. A surface of the first tapered portion 13 opposite to the component contact surface 12 forms an inclined surface that is gradually displaced to the component contact surface 12 side toward the main cooling surface 11. An opposite surface of the first tapered portion 13 from the component contact surface 12 forms a perpendicular surface 13a parallel to the component contact surface 12 and orthogonal to the main cooling surface 11. An opposite surface of the heat radiating plate 20 from the substrate fixing surface 25 forms an inclined surface conforming to the inclined surface of the first tapered portion 13, and an opposite portion of the heat radiating plate 20 from the substrate fixing surface 25 forms the second tapered portion 22.

The inner wall surface of the casing 10 located on the rear side in the X direction forms an inclined surface that is gradually displaced to the rear side in the X direction toward the main cooling surface 11. A side wall portion of the casing 10 located on the rear side in the X direction forms the first tapered portion 13. An opposite surface of the heat radiating plate 20 from the substrate fixing surface 25 forms an inclined surface conforming to the above-mentioned inclined surface, and an opposite portion of the heat radiating plate 20 from the substrate fixing surface 25 forms the second tapered portion 22.

An electric power converter 101 according to the second embodiment is configured in the same manner as the electric power converter 100 of the first embodiment described above except that the first tapered portion 13 having a protrusion shape is formed in the casing 10.

In the second embodiment, when the heat radiating plate 20 having the substrate 30 mounted thereto to which the MOSFETs 2 are mounted is inserted into the casing 10, the heat radiating plate 20 is displaced forward in the X direction while the second tapered portion 22 is slid to move on the inclined surface of the first tapered portion 13 of the casing 10. With this structure, the MOSFET 2 mounted to the substrate 30 is brought into contact with the component contact surface 12 of the casing 10 through intermediation of the heat radiating sheet 50. Thus, heat generated in the MOSFET 2 is radiated toward the cooling device 9 via the casing 10 through two paths, specifically, the substrate fixing surface 25 of the heat radiating plate 20 to which the substrate 30 is fixed, and the component contact surface 12 of the casing 10.

Further, when the heat radiating plate 20 having the substrate 30 mounted thereto to which the core 7 is mounted is inserted into the casing 10, the heat radiating plate 20 is displaced forward in the X direction while the second tapered portion 22 is slid to move on the inclined surface of the first tapered portion 13 of the casing 10. With this structure, the core 7 is brought into contact with the perpendicular surface 13a of the first tapered portion 13. Thus, heat is radiated toward the cooling device 9 via the casing 10 through two paths, specifically, the substrate fixing surface 25 of the heat radiating plate 20 to which the substrate 30 is fixed, and the perpendicular surface 13a of the first tapered portion 13. In this case, the perpendicular surface 13a forms the component contact surface 12 of the casing 10.

The first tapered portion 13 has the same height as that of the heat radiating plate 20. Thus, a contact area between the first tapered portion 13 and the second tapered portion 22 can be increased, thereby reducing a heat resistance from the MOSFET 2, the diode 4, and the core 7 being the heat generating components, to the cooling device 9. Further, in the heat generating components mounted to the substrate 30, a heat radiation path for the heat generating component far from the main cooling surface 11 and a heat radiation path for the heat generating component near the main cooling surface 11 do not interfere with each other, and hence a heat resistance can be further reduced.

Figure 28:
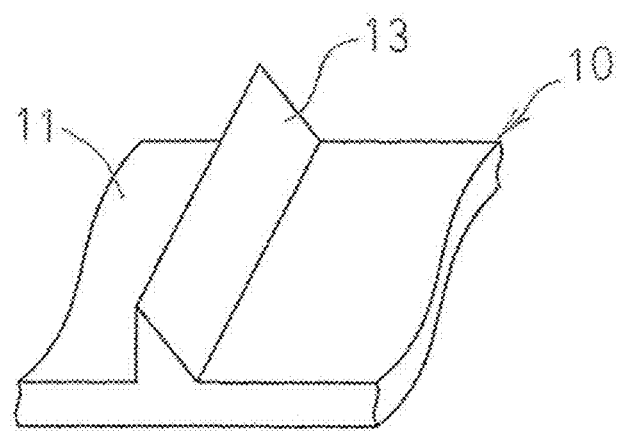
FIG. 28 is a perspective view of a first tapered portion in the electric power converter according to the second embodiment of the present invention.
Figure 29:
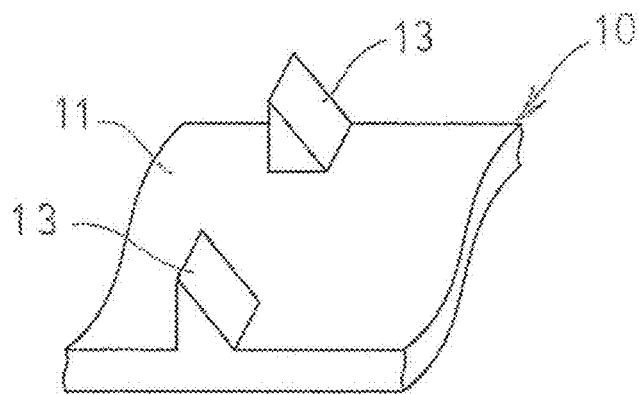
FIG. 29 is a perspective view of a first modification example of the first tapered portion in the electric power converter according to the second embodiment of the present invention.
Figure 30:
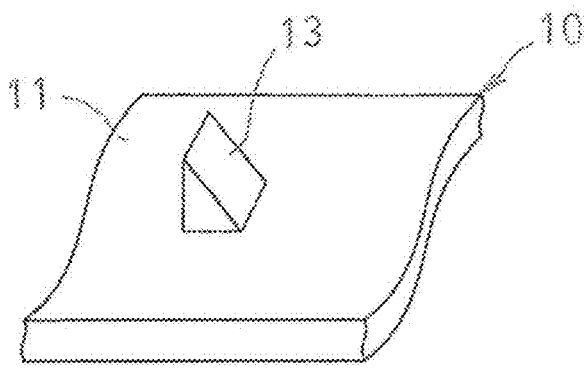
FIG. 30 is a perspective view of a second modification example of the first tapered portion in the electric power converter according to the second embodiment of the present invention.

Next, a shape of the first tapered portion 13 formed in the main cooling surface 11 of the casing 10 is described. As illustrated in FIG. 28, the first tapered portion 13 may be formed so as to extend from one side to the other side in the width direction of the main cooling surface 11 orthogonal to the X direction being the sliding direction. Further, as illustrated in FIG. 29, the first tapered portion 13 may be formed to be divided on both sides in the width direction of the main cooling surface 11. Further, as illustrated in FIG. 30, the first tapered portion 13 may be formed at the center position in the width direction of the main cooling surface 11. In this way, as long as the first tapered portion 13 allows the heat radiating plate 20 to be slid to move in the X direction, the first tapered portion 13 may be formed at any position. In this case, the second tapered portion 22 formed in the heat radiating plate 20 is appropriately set in accordance with the shape and position of the first tapered portion 13 of the casing 10 so as to be slidably fitted to the first tapered portion 13 of the casing 10.

Third Embodiment

Figure 31:
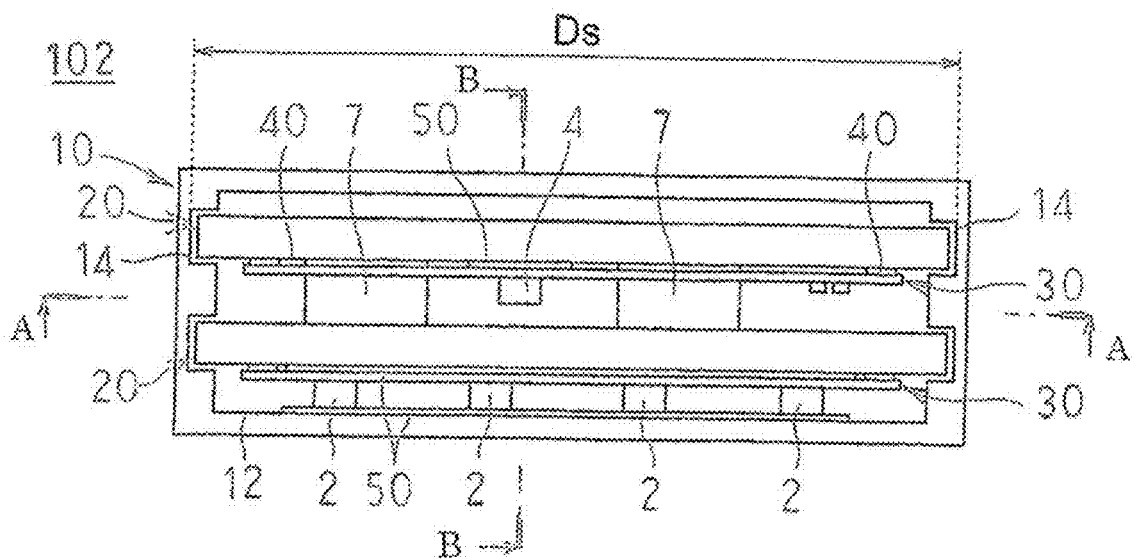
FIG. 31 is a top view of an electric power converter according to a third embodiment of the present invention.
Figure 32:
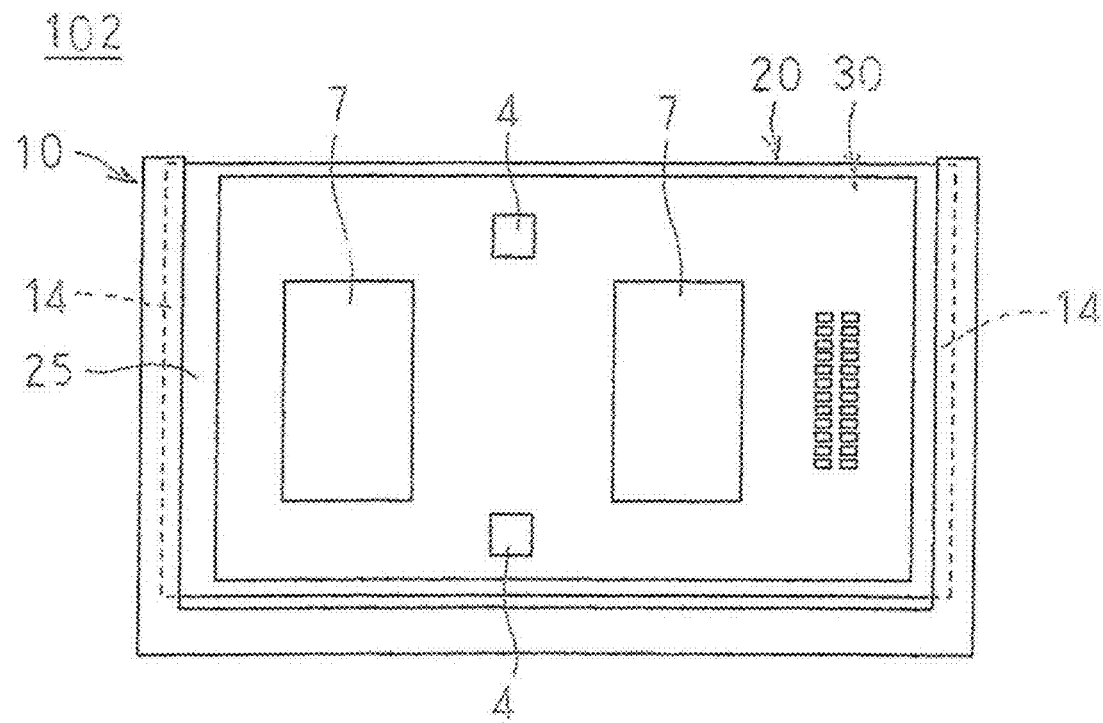
FIG. 32 is a sectional view taken along the arrow line A-A of FIG. 31.
Figure 33:
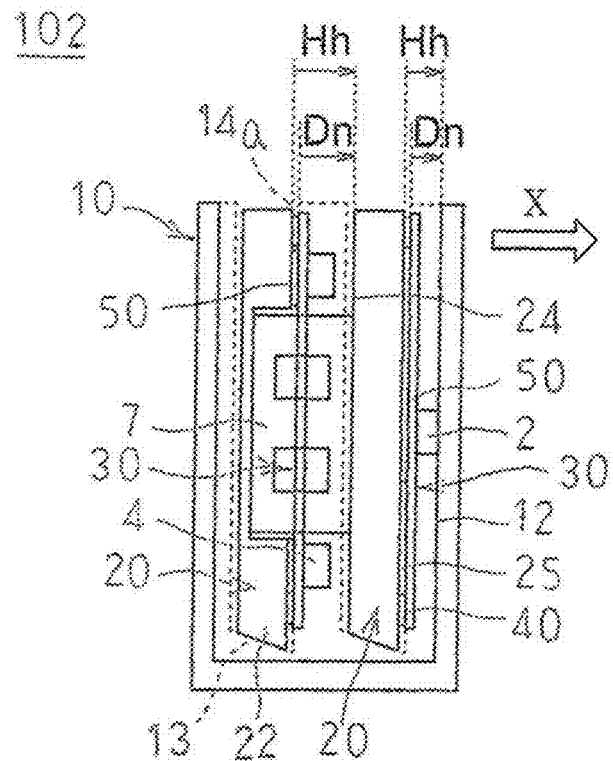
FIG. 33 is a sectional view taken along the arrow line B-B of FIG. 31.
Figure 34:
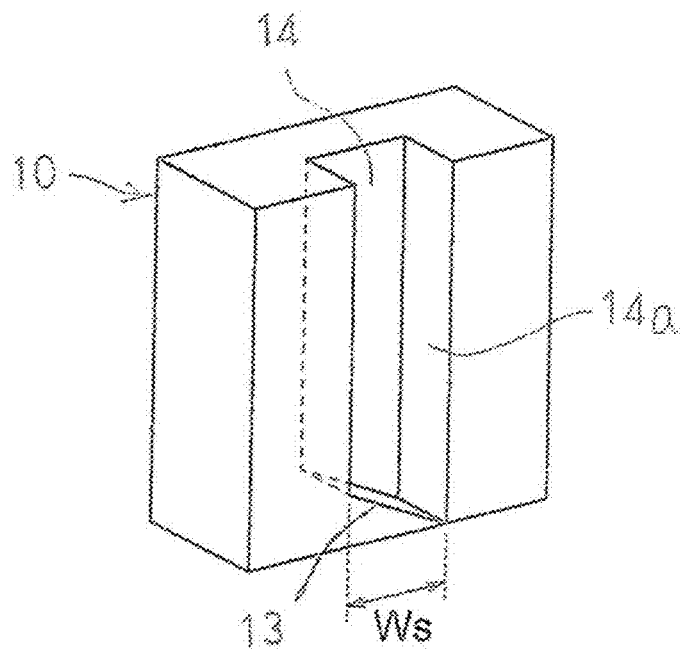
FIG. 34 is a perspective view of main components for illustrating a configuration of a slit in the electric power converter according to the third embodiment of the present invention.

FIG. 31 is a top view of an electric power converter according to a third embodiment of the present invention. FIG. 32 is a sectional view taken along the arrow line A-A of FIG. 31. FIG. 33 is a sectional view taken along the arrow line B-B of FIG. 31. FIG. 34 is a perspective view of main components for illustrating a configuration of a slit in the electric power converter according to the third embodiment of the present invention.

In FIG. 31 to FIG. 34, slits 14 are formed opposite to each other in both inner wall surfaces of the casing 10 which are opposite to each other across the main cooling surface 11 in a direction orthogonal to the X direction. Two pairs of thus-formed slits 14 are provided apart from each other in the X direction. The slits 14 are formed by forming recesses in both inner wall surfaces of the casing 10, so as to extend from an upper end to the main cooling surface 11. Front and rear side wall surfaces of each slit 14 in the X direction form flat surfaces orthogonal to the main cooling surface 11 and the X direction. That is, the slit 14 has a constant width Ws. The front side wall surface of the slit 14 in the X direction is referred to as an outline 14a of the slit 14. A bottom portion of the slit 14 forms an inclined surface having a height that is gradually decreased toward the fore side in the X direction. That is, the thickness of the bottom portion of the slit 14 is gradually reduced toward the fore side in the X direction. The bottom portion of the slit 14 forms the first tapered portion 13. Both side portions of the bottom portion of the heat radiating plate 20 each form an inclined surface conforming to the first tapered portion 13 of the slit 14. The both side portions of the bottom portion of the heat radiating plate 20 form the second tapered portion 22. The first tapered portion 13 of the slit 14 and the second tapered portion 22 of the heat radiating plate 20 have the same taper angles as those in the first embodiment.

Here, the width of the heat radiating plate 20 is larger than an inner width of the casing 10 in a direction orthogonal to the X direction, and is smaller than a distance Ds between the bottom surfaces of the opposite slits 14. Further, the width Ws of the silt 14 is larger than the thickness of the heat radiating plate 20. For example, the inner width of the casing 10 is 135 mm, the distance Ds between the slits 14 is 150 mm, and the width of the heat radiating plate 20 is 145 mm. The thickness of the heat radiating plate 20 is 9 mm, and the width Ws of the slit 14 is 10 mm. With this structure, the heat radiating plate 20 can be inserted to the pair of slits 14 of the casing 10.

Further, a distance from the outline 14a of the slit 14 to the component contact surface 24 of the heat radiating plate 20 on the fore side in the X direction or to the component contact surface 12 of the casing 10 is defined as Dn. A distance from the substrate fixing surface 25 of the heat radiating plate 20 to the top of the heat generating component mounted to the substrate 30 is defined as Hh. Then, Dn and Hh satisfy a relationship of Dn>Hh.

Other configuration of an electric power converter 102 of the third embodiment is the same as those of the electric power converter 100 of the first embodiment described above and the electric power converter 101 of the second embodiment described above.

In the third embodiment, the heat radiating plate 20 is inserted into the casing 10 by being inserted to the corresponding pair of slits 14. Then, the second tapered portion 22 of the heat radiating plate 20 is brought into contact with the first tapered portion 13 of the bottom portion of the slit 14, and the heat radiating plate 20 is slid to move forward in the X direction along the first tapered portion 13. The MOSFET 2 being the heat generating component mounted to the substrate 30 fixed to the heat radiating plate 20 located on the fore side in the X direction is brought into contact with the component contact surface 12 of the casing 10. Further, the core 7 being the heat generating component mounted to the substrate 30 fixed to the heat radiating plate 20 located on the rear side in the X direction is brought into contact with the component contact surface 24 of the heat radiating plate 20 located on the fore side in the X direction. With this structure, the MOSFET 2 is pressed against the component contact surface 12 of the casing 10.

Therefore, also in the third embodiment, the same effects as those in the first and second embodiments described above can be obtained.

In the third embodiment, the heat radiating sheet 50 or a potting resin may be provided between the core 7 and the component contact surface 24 and between the MOSFET 2 and the component contact surface 12.

Further, in the third embodiment, the two pairs of slits 14 are formed apart from each other in the X direction, but in a case of three heat radiating plates 20, three pairs of slits 14 are formed apart from each other in the X direction.

Fourth Embodiment

Figure 35:
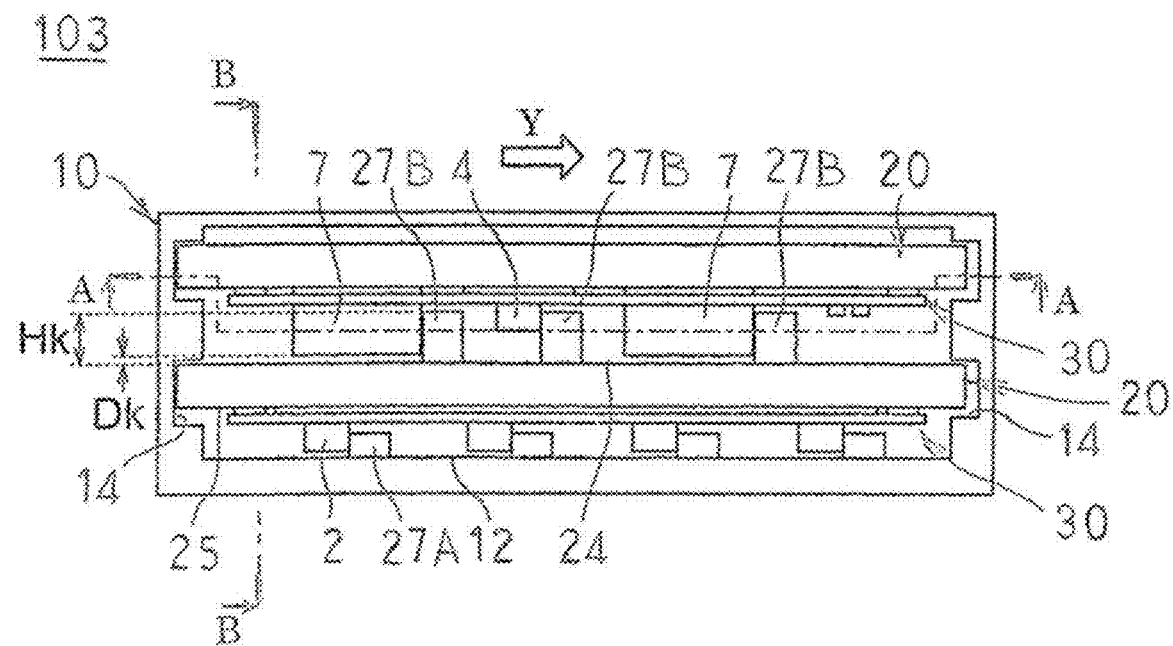
FIG. 35 is a top view of an electric power converter according to a fourth embodiment of the present invention.
Figure 36:
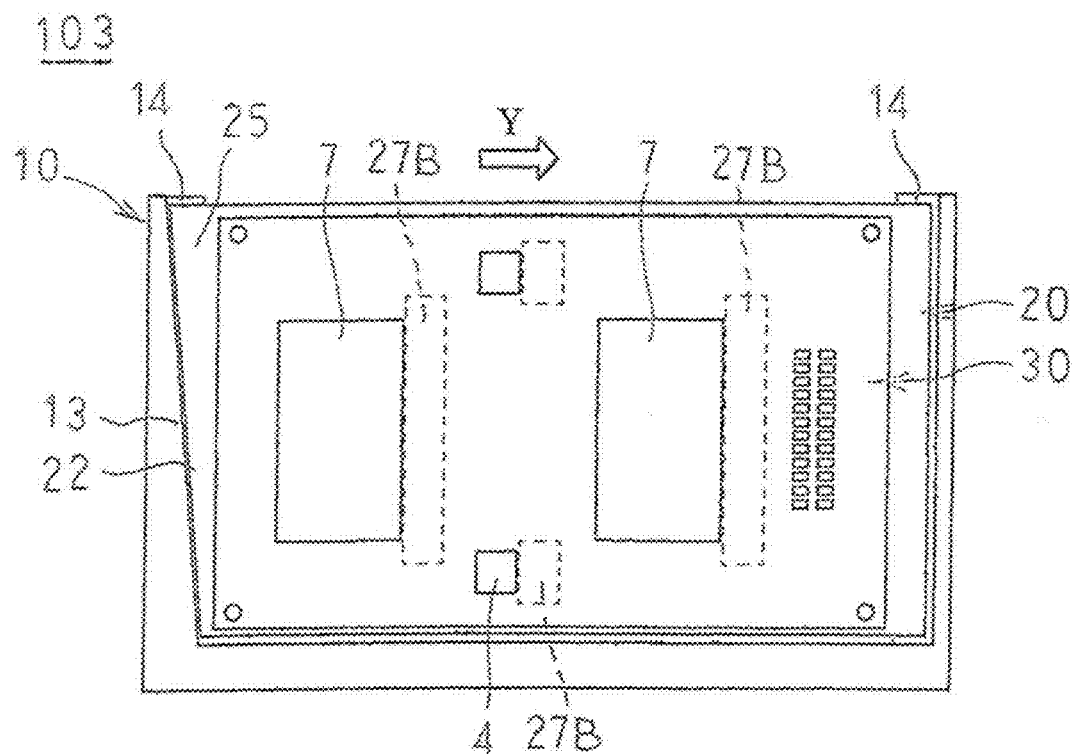
FIG. 36 is a sectional view taken along the arrow line A-A of FIG. 35.
Figure 37:
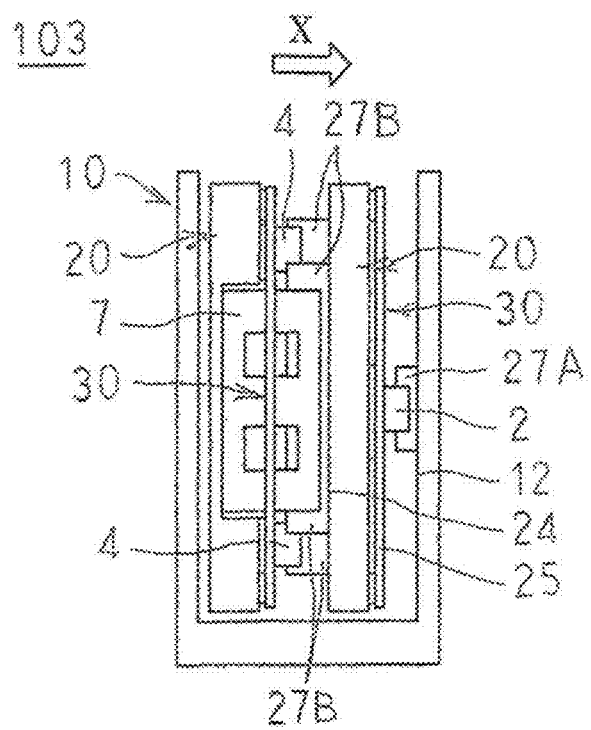
FIG. 37 is a sectional view taken along the arrow line B-B of FIG. 35.
Figure 38:
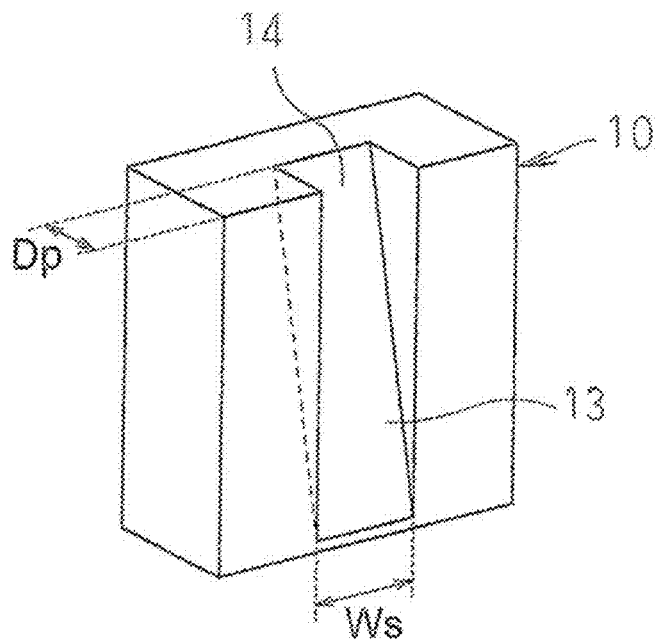
FIG. 38 is a perspective view of main components for illustrating a configuration of a slit in the electric power converter according to the fourth embodiment of the present invention.

FIG. 35 is a top view of an electric power converter according to a fourth embodiment of the present invention. FIG. 36 is a sectional view taken along the arrow line A-A of FIG. 35. FIG. 37 is a sectional view taken along the arrow line B-B of FIG. 35. FIG. 38 is a perspective view of main components for illustrating a configuration of a slit in the electric power converter according to the fourth embodiment of the present invention.

In FIG. 35 to FIG. 38, slits 14 are formed opposite to each other in both inner wall surfaces of the casing 10 which are opposite to each other across the main cooling surface 11 in a Y direction orthogonal to the X direction. Two pairs of thus-formed slits 14 are provided apart from each other in the X direction. The slits 14 are formed by forming recesses in both inner wall surfaces of the casing 10, so as to extend from the upper end to the main cooling surface 11. The slit 14 has the constant width Ws, which is larger than the thickness of the heat radiating plate 20. The slit 14 on the rear side in the Y direction has a depth Dp that is gradually reduced from the upper end toward the main cooling surface 11. That is, the bottom surface of the slit 14 on the rear side in the Y direction forms an inclined surface that is gradually displaced forward in the Y direction from the upper end toward the main cooling surface 11, and forms the first tapered portion 13. The slit 14 on the fore side in the Y direction has a constant depth. A side portion of the heat radiating plate 20 on the rear side in the Y direction forms an inclined surface conforming to the first tapered portion 13 of the slit 14, and thus forms the second tapered portion 22. The side portion of the heat radiating plate 20 on the fore side in the Y direction forms a planar surface parallel to the bottom surface of the slit 14 on the fore side in the Y direction. The minimum width in the Y direction between the pair of slits 14 is larger than the minimum width of the heat radiating plate 20 in the Y direction. The phrase "fore side in the Y direction" used herein refers to a rightward direction in FIG. 36.

First metal blocks 27A are fixed to the component contact surface 12 of the casing 10 so as to be located ahead of the MOSFETs 2 being the heat generating components in the Y direction. Further, second metal blocks 27B are fixed to the component contact surface 24 of the heat radiating plate 20 on the fore side in the X direction so as to be located ahead of the cores 7 and the diodes 4 being the heat generating components in the Y direction. Further, the first metal block 27A and the second metal block 27B each have height Hk larger than a distance Dk between the heat generating component and the component contact surfaces 24 and 12 facing the heat generating component.

Other configuration of an electric power converter 103 of the fourth embodiment is the same as those of the electric power converters 100 to 102 of the first to third embodiments, respectively.

In the fourth embodiment, the heat radiating plate 20 is inserted into the casing 10 by being inserted to each pair of slits 14. Then, the second tapered portion 22 of the heat radiating plate 20 is brought into contact with the first tapered portion 13 of the slit 14, and the heat radiating plate 20 is slid to move forward in the Y direction along the first tapered portion 13. With this structure, the MOSFET 2 being the heat generating component mounted to the substrate 30 fixed to the heat radiating plate 20 located on the fore side in the X direction is brought into contact with the first metal block 27A protruding from the component contact surface 12 of the casing 10. Further, the core 7 and the diode 4 being the heat generating components mounted to the substrate 30 fixed to the heat radiating plate 20 located on the rear side in the X direction are brought into contact with the second metal block 27B protruding from the component contact surface 24 of the heat radiating plate 20 on the fore side in the X direction.

Therefore, also in the fourth embodiment, the same effects as those in the first to third embodiments described above can be obtained.

In the first to third embodiments described above, the heat radiating plate 20 slidably moves in the X direction, and in the fourth embodiment, the heat radiating plate 20 slidably moves in the Y direction. As described above, according to the present invention, the sliding movement direction of the heat radiating plate 20 can be freely set in accordance with the positions of the cooling device 9 and the heat generating component, and hence a degree of freedom in the arrangement of the heat generating components is enhanced.

Fifth Embodiment

Figure 39:
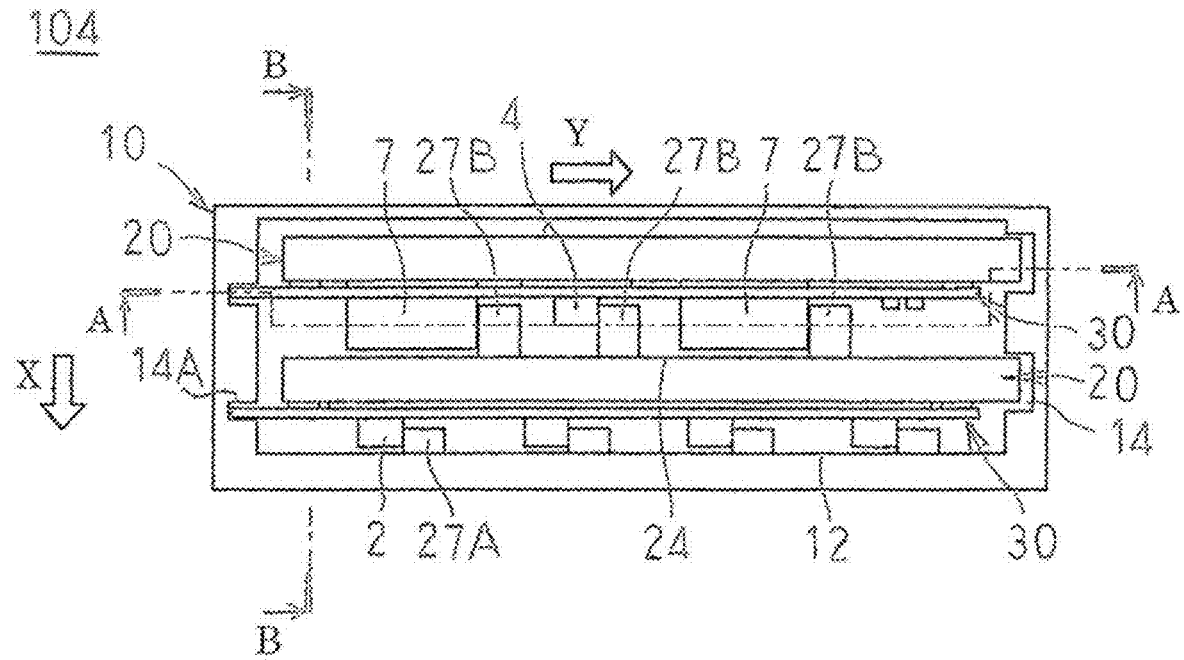
FIG. 39 is a top view of an electric power converter according to a fifth embodiment of the present invention.
Figure 40:
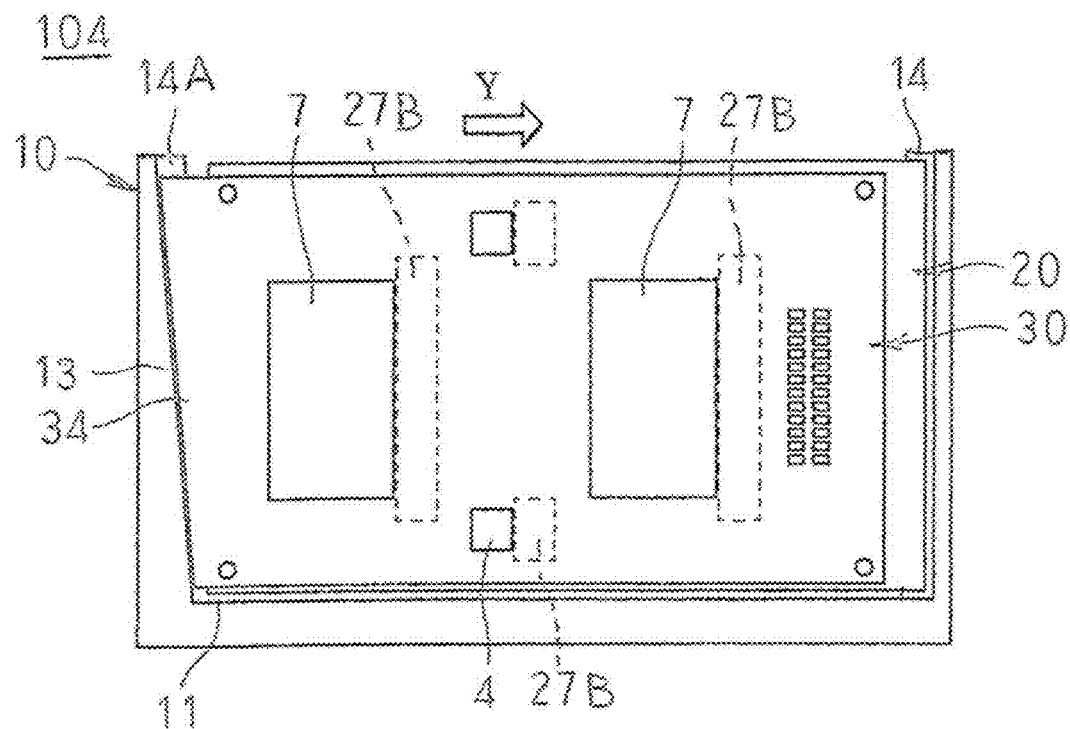
FIG. 40 is a sectional view taken along the arrow line A-A of FIG. 39.
Figure 41:
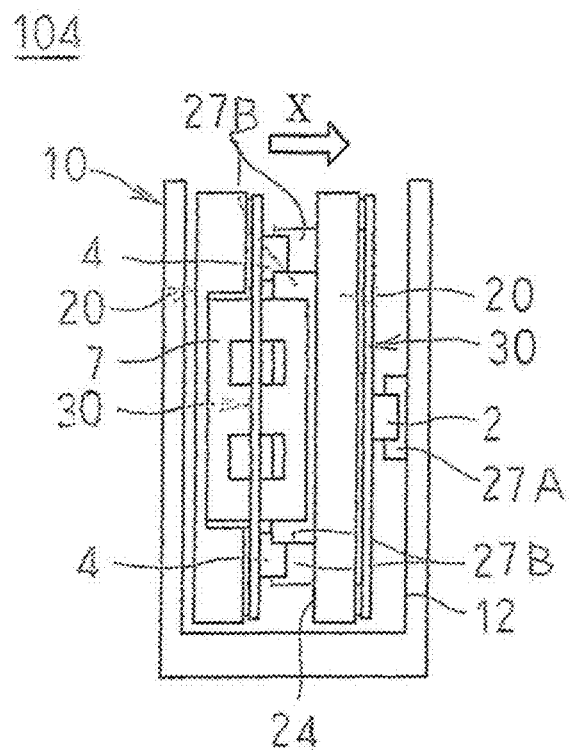
FIG. 41 is a sectional view taken along the arrow line B-B of FIG. 39.

FIG. 39 is a top view of an electric power converter according to a fifth embodiment of the present invention. FIG. 40 is a sectional view taken along the arrow line A-A of FIG. 39. FIG. 41 is a sectional view taken along the arrow line B-B of FIG. 39.

In FIG. 39 to FIG. 41, the substrate 30 is fixed to the substrate fixing surface 25 of the heat radiating plate 20 in a state of protruding from the heat radiating plate 20 to the rear side in the Y direction. The slits 14 are formed by forming a recess in the inner wall surface of the casing 10 opposite to the heat radiating plate 20 on the fore side in the Y direction, so as to extend from the upper end to the main cooling surface 11. A slit 14A is formed by forming a recess in the inner wall surface of the casing 10 opposite to the substrate 30 on the rear side in the Y direction, so as to extend from the upper end to the main cooling surface 11. Two pairs of thus-formed slits 14 and 14A are provided apart from each other in the X direction. The slit 14 has a constant width, which is larger than the thickness of the heat radiating plate 20. The slit 14 has a constant depth. The slit 14A has a constant width, which is larger than the thickness of the substrate 30. The slit 14A has a depth that is gradually reduced from the upper end toward the main cooling surface 11. That is, a bottom surface of the slit 14A forms an inclined surface that is gradually displaced forward in the Y direction from the upper end toward the main cooling surface 11, and forms the first tapered portion 13. A side portion of the substrate 30 on the rear side in the Y direction forms an inclined surface conforming to the first tapered portion 13 of the slit 14A, and thus forms a second tapered portion 34. The side portion of the heat radiating plate 20 on the fore side in the Y direction forms a planar surface parallel to the bottom surface of the slit 14. The minimum width in the Y direction between the pair of slits 14 and 14A is larger than the minimum width of the integral of the heat radiating plate 20 and the substrate 30 in the Y direction.

Other configuration of an electric power converter 104 of the fifth embodiment is the same as that of the electric power converter 103 of the fourth embodiment described above.

In the fifth embodiment, the heat radiating plate 20 and the substrate 30 are inserted into the casing 10 by being inserted to each pair of slits 14 and 14A. Then, the second tapered portion 34 of the substrate 30 is brought into contact with the first tapered portion 13 of the slit 14A, and the substrate 30 is slid to move forward in the Y direction along the first tapered portion 13. With this structure, the MOSFET 2 being the heat generating component mounted to the substrate 30 fixed to the heat radiating plate 20 located on the fore side in the X direction is brought into contact with the first metal block 27A protruding from the component contact surface 12 of the casing 10. Further, the core 7 and the diode 4 being the heat generating components mounted to the substrate 30 fixed to the heat radiating plate 20 located on the rear side in the X direction are brought into contact with the second metal block 27B protruding from the component contact surface 24 of the heat radiating plate 20 on the fore side in the X direction.

Therefore, also in the fifth embodiment, the same effects as those in the fourth embodiment described above can be obtained. According to the fifth embodiment, the second tapered portion 34 is formed not in the heat radiating plate 20 but in the substrate 30 that is easy to process, and hence the second tapered portion 34 can be formed at low cost.

Sixth Embodiment

Figure 42:
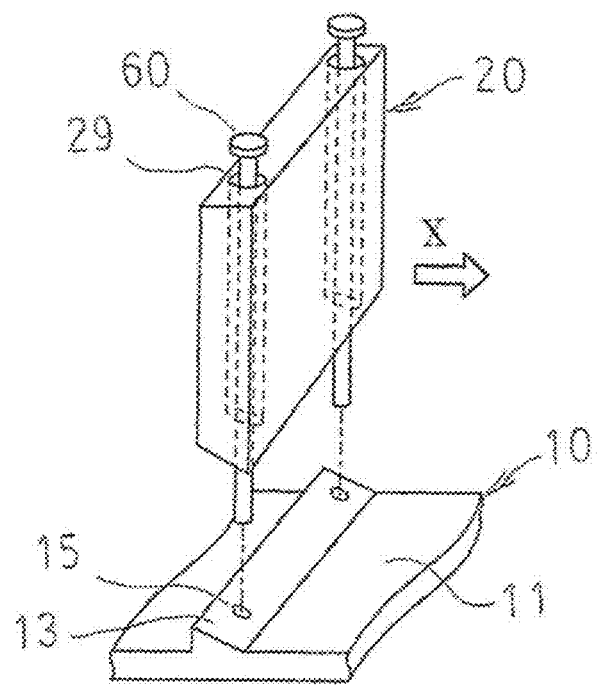
FIG. 42 is a perspective view of main components for illustrating a fixing method for a heat radiating plate in an electric power converter according to a sixth embodiment of the present invention.
Figure 43:
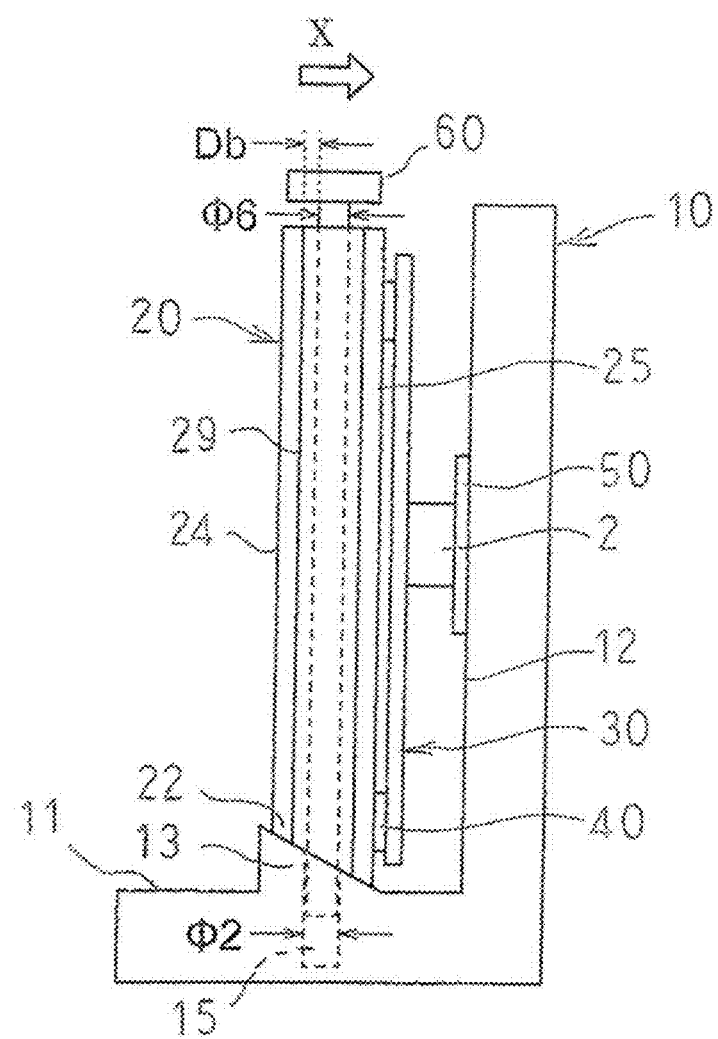
FIG. 43 is a side view of main components for illustrating a fixed state of the heat radiating plate in the electric power converter according to the sixth embodiment of the present invention.

FIG. 42 is a perspective view of main components for illustrating a fixing method for a heat radiating plate in an electric power converter according to a sixth embodiment of the present invention. FIG. 43 is a side view of main components for illustrating a fixed state of the heat radiating plate in the electric power converter according to the sixth embodiment of the present invention.

In FIG. 42 and FIG. 43, fixing holes 29 each have an elongated hole shape that extends in the X direction, and are formed at two positions apart from each other in a direction orthogonal to the X direction so as to pass vertically through the heat radiating plate 20. Heat radiating plate-fixing screw holes 15 are formed in the first tapered portion 13 formed in the main cooling surface 11 of the casing 10 in correspondence with the fixing holes 29.

Other configuration is the same as that of the first embodiment described above.

In the sixth embodiment, heat radiating plate-fixing screws 60 are inserted into the fixing holes 29 of the heat radiating plate 20 and fastened to the heat radiating plate-fixing screw holes 15. With this, the second tapered portion 22 of the heat radiating plate 20 is slid to move forward in the X direction along the first tapered portion 13 of the casing 10. The MOSFET 2 mounted to the substrate 30 is brought into contact with the component contact surface 12 of the casing 10 through intermediation of the heat radiating sheet 50. At this time, positions of the heat radiating plate-fixing screw holes 15 of the casing 10, a thread diameter Φ6 of the heat radiating plate-fixing screw 60, a screw hole diameter Φ2 of the heat radiating plate-fixing screw hole 15, and a shape and position of the fixing holes 29 are set so that a distance Db between a wall surface of the fixing hole 29 on the rear side in the X direction and the heat radiating plate-fixing screw 60 becomes larger than 0 mm. Thus, as the heat radiating plate-fixing screw 60 is fastened more tightly, the heat radiating plate 20 is slid to move along the first tapered portion 13 of the casing 10, and a degree of adhesion between the MOSFET 2 and the component contact surface 12 of the casing 10 through intermediation of the heat radiating sheet 50 becomes higher.

In the sixth embodiment described above, the description is given of the fixing method for the heat radiating plate 20 located on the fore side in the X direction, but the heat radiating plate 20 located on the rear side in the X direction is similarly fixed.

In the sixth embodiment described above, the description is given of the fixing method for the heat radiating plate 20 in the electric power converter 100 of the first embodiment described above, but the fixing method may be applied to the fixing of the heat radiating plate 20 in the electric power converters 101 to 104 of the other embodiments.

Seventh Embodiment

Figure 44:
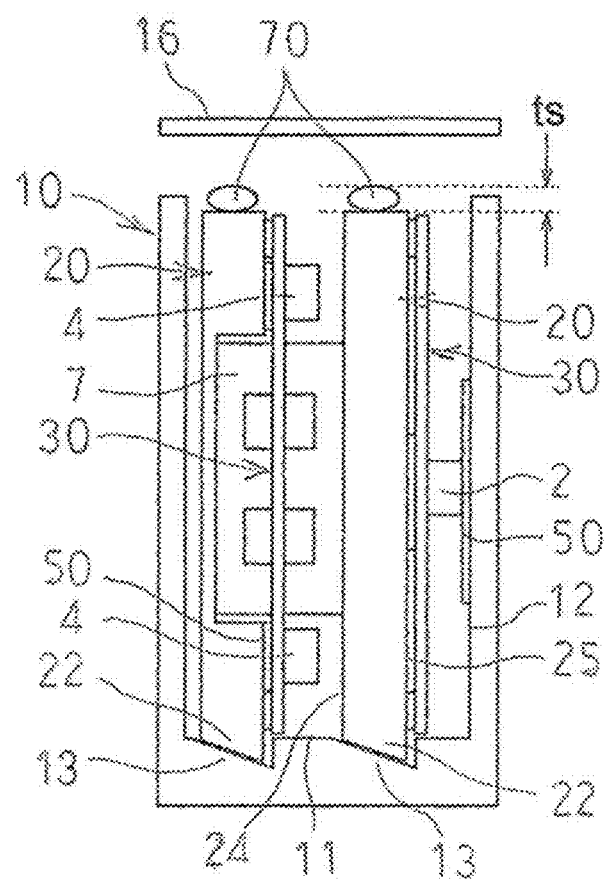
FIG. 44 is a perspective view of main components for illustrating a fixing method for a heat radiating plate in an electric power converter according to a seventh embodiment of the present invention.
Figure 45:
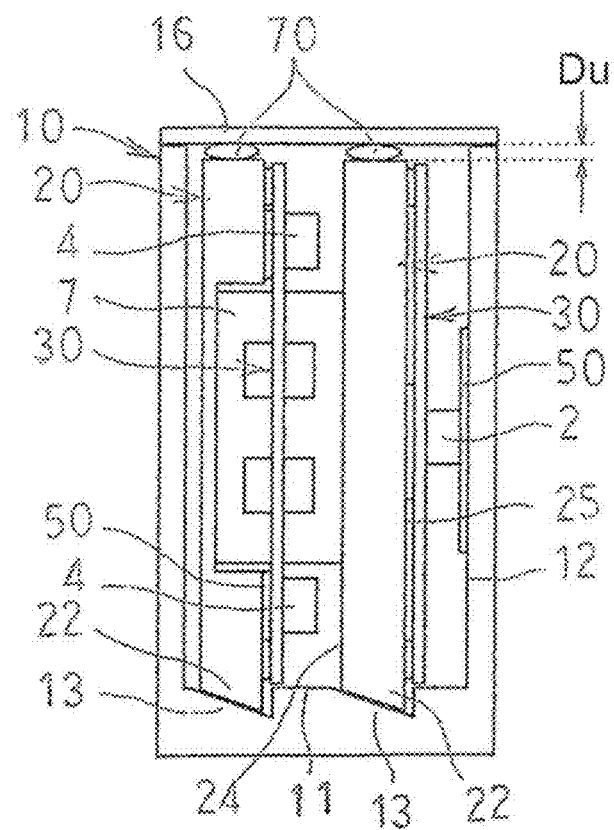
FIG. 45 is a sectional view of the electric power converter according to the seventh embodiment of the present invention.

FIG. 44 is a perspective view of main components for illustrating a fixing method for a heat radiating plate in an electric power converter according to a seventh embodiment of the present invention. FIG. 45 is a sectional view of the electric power converter according to the seventh embodiment of the present invention.

In FIG. 44 and FIG. 45, elastic members 70 are each provided at an end portion of the heat radiating plate 20 on an opposite side to the main cooling surface 11. A fixing member 16 is fixed to the casing 10 so as to close the upper opening of the casing 10. With this structure, each elastic member 70 is provided in a compressed state between the fixing member 16 and the heat radiating plate 20. The elastic member 70 may be a resin sheet or a flat spring, for example. A thickness ts of the elastic member 70 in a state of not yet being fixed by the fixing member 16 is larger than a thickness Du of the elastic member 70 in a state of being fixed by the fixing member 16.

In the seventh embodiment, in such a state that the fixing member 16 is mounted to the casing 10, the elastic member 70 is compressed to change the thickness from the thickness ts to the thickness Du. As a result, a restoring force of the elastic member 70 acts on the heat radiating plate 20, and the heat radiating plate 20 is slid to move along the first tapered portion 13 of the casing 10. Thus, a degree of adhesion between the MOSFET 2 and the component contact surface 12 of the casing 10 through intermediation of the heat radiating sheet 50 is enhanced. Further, a degree of adhesion between the core 7 and the component contact surface 24 of the heat radiating plate 20 is enhanced.

According to the seventh embodiment, with the restoring force of the elastic member 70, the contact state between the heat generating component and the component contact surface 12 of the casing 10 and the contact state between the heat generating component and the component contact surface 24 of the heat radiating plate 20 are maintained. Thus, the insertion direction of the heat radiating plate 20 is not limited to the direction of gravity, and hence a degree of freedom in the installation of the electric power converter 100 can be enhanced.

Further, the heat radiating plate 20 is thermally connected to the fixing member 16 through intermediation of the elastic member 70. Thus, a thermal path extending from the heat generating component via the heat radiating plate 20, the elastic member 70, and the fixing member 16 to the casing 10 is formed. Consequently, more thermal paths from the heat generating component to the cooling device 9 are ensured, and the heat generating components can be more efficiently cooled.

In the seventh embodiment described above, the description is given of the fixing method for the heat radiating plate 20 in the electric power converter 100 of the first embodiment described above, but the fixing method may be applied to the fixing of the heat radiating plate 20 in the electric power converters 101 to 104 of the other embodiments.

In the embodiments described above, the description is given of the case in which the heat radiating plates are accommodated in the casing in a state of being arranged in a row on the main cooling surface, but the heat radiating plates may be accommodated in the casing in a state of being arranged in a plurality of rows on the main cooling surface. Also in this case, the heat radiating plates in each row may have the same configuration as those in the embodiments described above.

Eighth Embodiment

Figure 46:
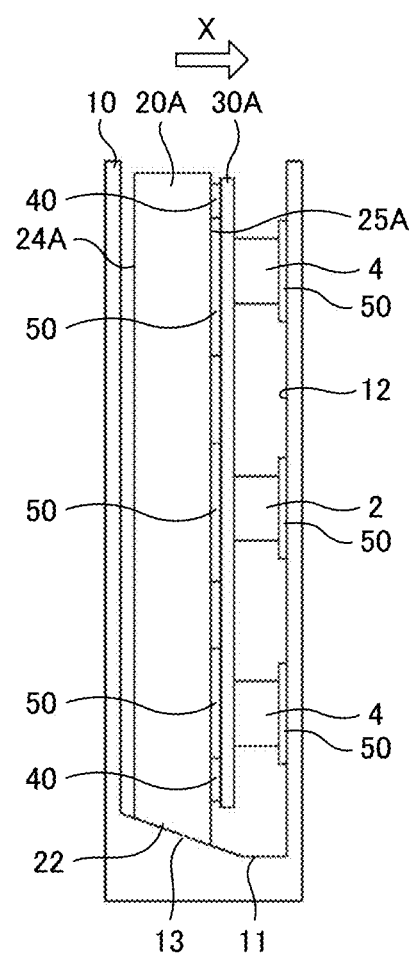
FIG. 46 is a sectional view of an electric power converter according to an eighth embodiment of the present invention.

FIG. 46 is a sectional view of an electric power converter according to an eighth embodiment of the present invention. The eighth embodiment has a feature in that the number of heat radiating plates 20A inserted into the casing 10 is one as compared with the first embodiment. That is, in the eighth embodiment, the number of heat radiating plates 20A arranged in the X direction is one.

In FIG. 46, the main cooling surface 11 of the casing 10 has one first tapered portion 13. The first tapered portion 13 has an inclined surface that is inclined with respect to the component contact surface 12. The inclined surface is inclined so as to increase the distance to the upper opening of the casing 10 as the distance to the component contact surface 12 decreases.

The heat radiating plate 20A has a main surface 25A, a main surface 24A, and the second tapered portion 22. The main surface 24A is opposite to the main surface 25A. That is, the main surface 24A is a surface located on an opposite side to the main surface 25A in the thickness direction of the heat radiating plate 20A. The second tapered portion 22 has an inclined surface that is inclined with respect to the main surface 25A and the main surface 24A. The inclined surface is also inclined with respect to the thickness direction of the heat radiating plate 20A. The second tapered portion 22 is formed so as to slide with respect to the first tapered portion 13 of the casing 10. Further, the second tapered portion 22 is connected to the first tapered portion 13 in a heat transferable manner, that is, in a heat exchangeable manner. The main surface 25A is located on the fore side of the heat radiating plate 20A in the X direction. The main surface 25A has fixed thereto a substrate 30A to which the heat generating components, for example, the MOSFET 2 and the diode 4 are mounted. With the substrate 30A being fixed to the heat radiating plate 20A, the MOSFET 2 and the diode 4 are connected to the heat radiating plate 20A in a heat exchangeable manner through intermediation of the heat radiating sheet 50 or the like.

The main surface 25A of the heat radiating plate 20A faces the component contact surface 12 being the inner side surface of the casing 10. The heat radiating plate 20A inserted into the casing 10 is displaced forward in the X direction by the second tapered portion 22 being slid with respect to the first tapered portion 13, until the heat generating components, for example, the MOSFET 2 and the diode 4 mounted to the substrate 30A are brought into contact with the component contact surface 12. The heat generating components, for example, the MOSFET 2 and the diode 4 are connected to the component contact surface 12 in a heat transferable manner, that is, in a heat exchangeable manner by the heat radiating plate 20A being displaced forward in the X direction. With this, heat generated in the heat generating components, for example, the MOSFET 2 and the diode 4 is radiated toward the cooling device 9 via two heat radiation paths, specifically, a path passing through the heat radiating plate 20A and the casing 10 and a path passing through the component contact surface 12 and the casing 10.

The first tapered portion 13 and the second tapered portion 22 each have an inclined surface, and thus a contact area between the casing 10 and the heat radiating plate 20A is increased. Thus, a heat resistance in the heat radiation path from the heat generating components, for example, the MOSFET 2 and the diode 4 to the cooling device 9 can be reduced. Further, the heat generating components mounted to the substrate 30A are connected to both the heat radiating plate 20A and the casing 10 in a heat exchangeable manner. Thus, more heat radiation paths from the heat generating component to the cooling device 9 are ensured, and the heat resistance in the heat radiation path from the heat generating component to the cooling device 9 can be further reduced.

Ninth Embodiment

Figure 47:
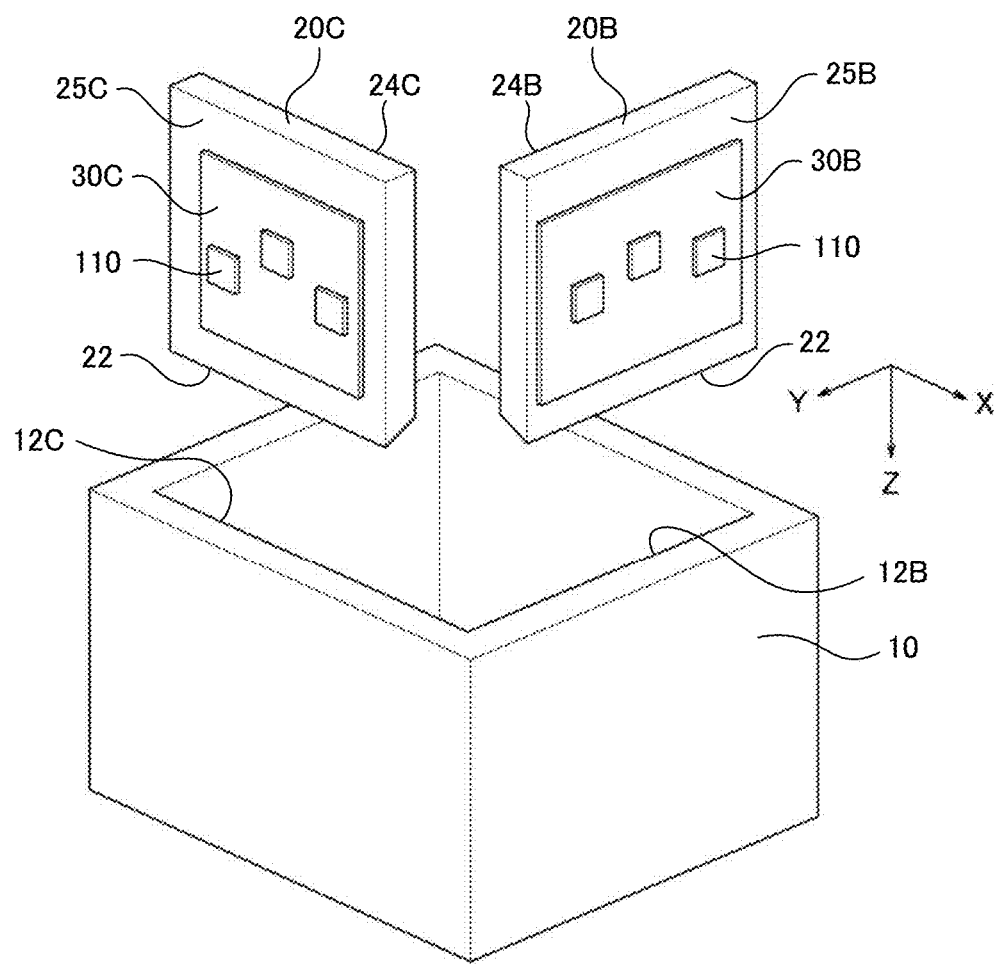
FIG. 47 is a perspective view of an electric power converter according to a ninth embodiment of the present invention.

FIG. 47 is a perspective view of an electric power converter according to a ninth embodiment of the present invention. A Z direction in FIG. 47 corresponds to a direction perpendicular to both of the X direction and the Y direction, for example, a vertically downward direction. The ninth embodiment has a feature in that a plurality of heat radiating plates 20B and 20C are displaced in different directions as compared with the first embodiment. Other configuration is the same as that of the first embodiment.

In FIG. 47, the casing 10 has, as inner side surfaces, an inner side surface 12B that is perpendicular to the X direction and faces backward in the X direction, and an inner side surface 12C that is perpendicular to the Y direction and faces backward in the Y direction. Although not shown, the main cooling surface 11 of the casing 10 has a first tapered portion extending along the inner side surface 12B, and the other first tapered portion extending along the inner side surface 12C. The directions in which the two first tapered portions extend are orthogonal to each other.

The heat radiating plate 20B has a main surface 25B, a main surface 24B, and the second tapered portion 22. The main surface 25B located on the fore side of the heat radiating plate 20B in the X direction faces the inner side surface 12B of the casing 10. The main surface 25B has fixed thereto a substrate 30B to which heat generating components 110 such as the MOSFET and the diode are mounted. The heat radiating plate 20B inserted into the casing 10 is displaced forward in the X direction by the second tapered portion 22 being slid with respect to the first tapered portion extending along the inner side surface 12B, until the heat generating component 110 mounted to the substrate 30B is brought into contact with the inner side surface 12B. The heat generating component 110 mounted to the substrate 30B is connected to the inner side surface 12B in a heat exchangeable manner by the heat radiating plate 20B being displaced forward in the X direction.

The heat radiating plate 20C has a main surface 25C, a main surface 24C, and the second tapered portion 22. The main surface 25C located on a fore side of the heat radiating plate 20C in the Y direction faces the inner side surface 12C of the casing 10. On the main surface 25C, a substrate 30C to which the heat generating component 110 such as the MOSFET and the diode is mounted, is fixed. The heat radiating plate 20C inserted into the casing 10 is displaced forward in the Y direction by the second tapered portion 22 being slid with respect to the first tapered portion extending along the inner side surface 12C, until the heat generating component 110 mounted to the substrate 30C is brought into contact with the inner side surface 12C. The heat generating component 110 mounted to the substrate 30C is brought into contact with the inner side surface 12C in a heat exchangeable manner by the heat radiating plate 20C being displaced forward in the Y direction.

The heat generating component 110 mounted to the substrate 30B is connected to both the heat radiating plate 20B and the casing 10 in a heat exchangeable manner. With this, more heat radiation paths from the heat generating component 110 mounted to the substrate 30B to the cooling device 9 are ensured, and hence a heat resistance in the heat radiation paths can be reduced. Likewise, the heat generating component 110 mounted to the substrate 30C is connected to both the heat radiating plate 20C and the casing 10 in a heat exchangeable manner. With this, more heat radiation paths from the heat generating component 110 mounted to the substrate 30C to the cooling device 9 are ensured, and hence a heat resistance in the heat radiation paths can be reduced.

In this embodiment, the displacement directions of the heat radiating plate 20B and the heat radiating plate 20C form an angle of 90°. However, the displacement directions of the heat radiating plate 20B and the heat radiating plate 20C may form an angle of 180°. Further, the displacement directions of the heat radiating plate 20B and the heat radiating plate 20C may form any angle other than 90° and 180°.

Tenth Embodiment

Figure 48:
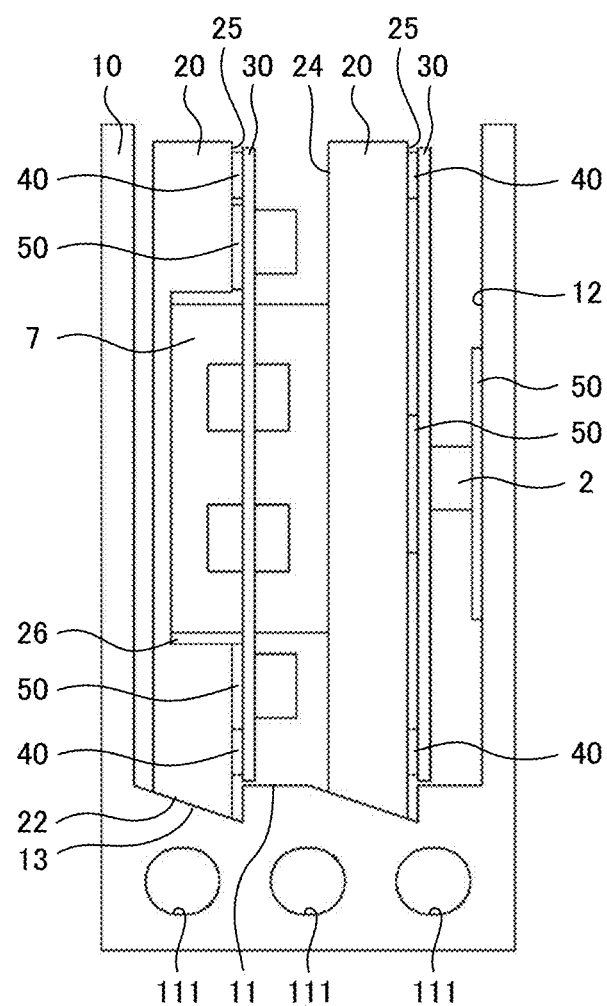
FIG. 48 is a sectional view of an electric power converter according to a tenth embodiment of the present invention.

FIG. 48 is a sectional view of an electric power converter according to a tenth embodiment of the present invention. In the first to ninth embodiments, the cooling device 9 produced from a different member from that of the casing 10 is used as a heat radiating unit. In contrast, in the tenth embodiment, the casing 10 itself includes a heat radiating unit. The tenth embodiment may be carried out in combination of any of the first to ninth embodiments.

In FIG. 48, a coolant flow path 111 through which a coolant such as cooling water circulates is formed at the bottom portion of the casing 10. The coolant flow path 111 is formed adjacent to the main cooling surface 11 of the casing 10. The coolant flow path 111 is a cooling mechanism provided inside the casing 10. The coolant flow path 111 functions as the heat radiating unit configured to radiate heat of the casing 10 to the outside. The heat transferred to the casing 10 is radiated to a coolant circulating in the coolant flow path 111. That is, the casing 10 is cooled through direct heat exchange with the coolant circulating in the coolant flow path 111 not via the cooling device being a different member. With this configuration, the heat radiating unit is provided inside the casing 10, and hence the heat radiation path from the heat radiating plate 20 to the heat radiating unit can be shortened. Thus, the heat generating component can be more effectively cooled.

Figure 49:
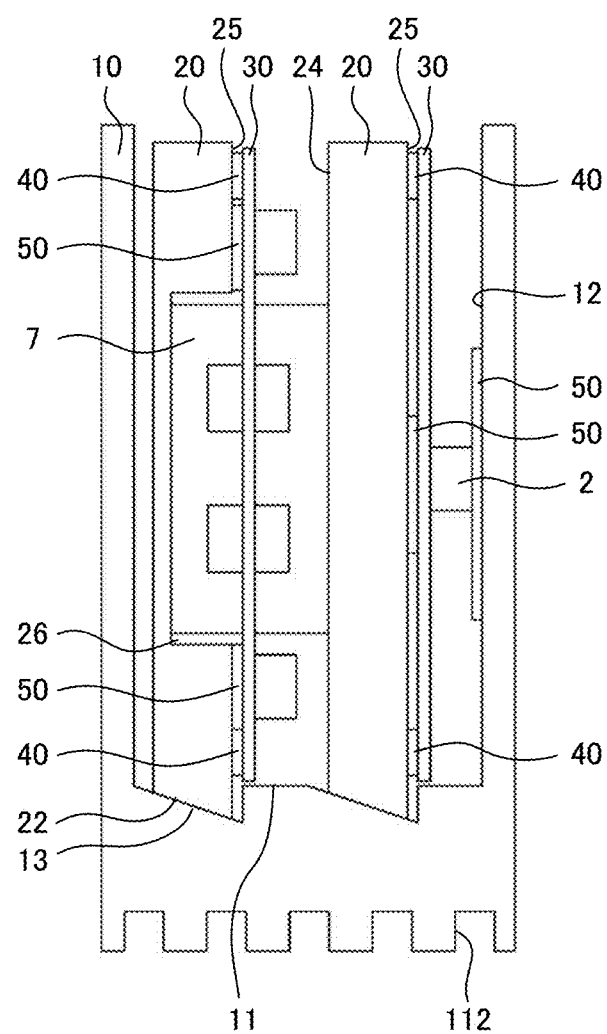
FIG. 49 is a sectional view of a modification example of the electric power converter according to the tenth embodiment of the present invention.

FIG. 49 is a sectional view of a modification example of the electric power converter according to the tenth embodiment of the present invention. In FIG. 49, in a part of the outer side surface of the casing 10, for example, a bottom surface facing the main cooling surface 11 out of the outer side surface of the casing 10, a protrusion/recess portion 112 having a heat radiating fin shape is formed. The protrusion/recess portion 112 functions as a heat radiating unit configured to radiate heat of the casing 10 to the outside. Heat transferred to the casing 10 is radiated via the protrusion/recess portion 112 to the air outside of the casing 10. That is, the casing 10 is cooled through direct heat exchange with the air outside of the casing 10 not via the cooling device being a different member. With this configuration, the heat radiating unit is provided on the casing 10 itself, and hence the heat radiation path from the heat radiating plate 20 to the heat radiating unit can be shortened. Therefore, the heat generating component can be more effectively cooled. Further, the protrusion/recess portion 112 formed in the outer side surface of the casing 10 itself serves as the heat radiating unit, and hence the heat generating component can be efficiently cooled with the use of fewer members.

Eleventh Embodiment

Figure 50:
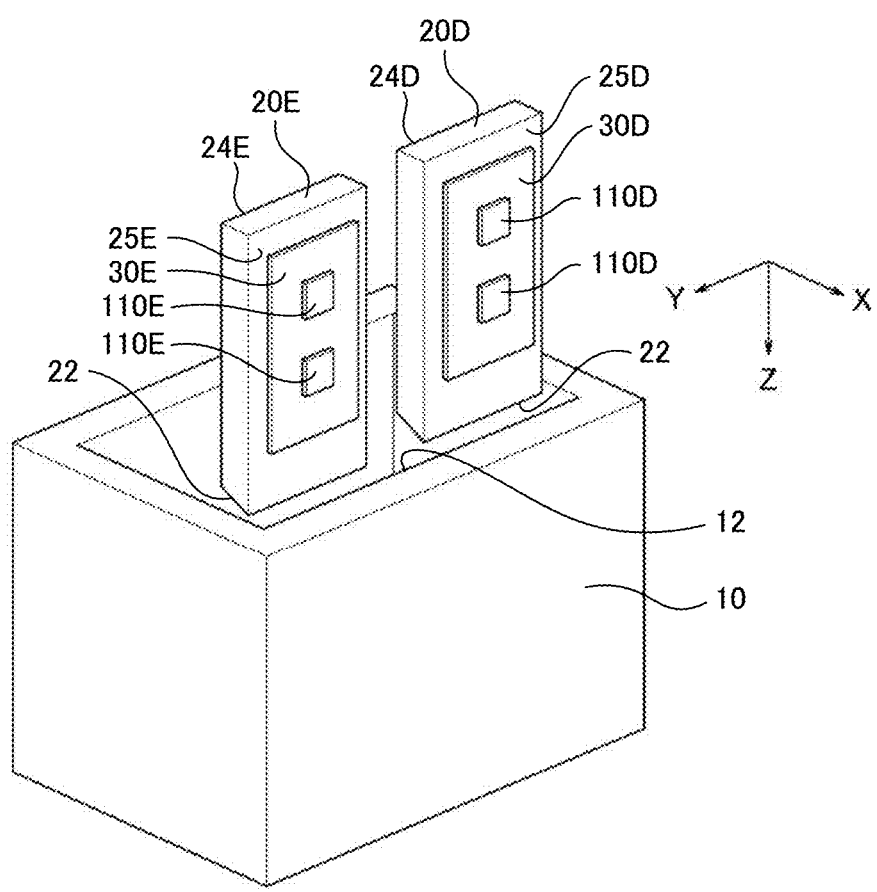
FIG. 50 is a perspective view of an electric power converter according to an eleventh embodiment of the present invention.

FIG. 50 is a perspective view of an electric power converter according to an eleventh embodiment of the present invention. The eleventh embodiment has a feature in that a plurality of heat radiating plates 20D and 20E are arranged side by side in a plurality of rows as compared with the first embodiment. Other configuration is the same as that of the first embodiment. In the configuration of FIG. 50, the number of heat radiating plates arranged in the X direction in each row is one, but the number of heat radiating plates arranged in the X direction in each row may be two or more. The eleventh embodiment can be carried out in combination of any of the first to tenth embodiments.

In FIG. 50, the heat radiating plate 20D and the heat radiating plate 20E are arranged side by side in two rows in the Y direction being the arrangement direction. The heat radiating plate 20D has a main surface 25D, a main surface 24D, and the second tapered portion 22. The heat radiating plate 20E has a main surface 25E, a main surface 24E, and the second tapered portion 22. The main surface 25D of the heat radiating plate 20D and the main surface 25E of the heat radiating plate 20E face the same component contact surface 12. On the main surface 25D, a substrate 30D having a heat generating component 110D mounted thereto is fixed. On the main surface 25E, a substrate 30E having a heat generating component 110E mounted thereto is fixed. For example, a component height of the heat generating component 110D which is defined based on the main surface 25D of the substrate 30D as a reference, is different from a component height of the heat generating component 110E which is defined based on the main surface 25E of the substrate 30E as a reference.

Although not shown, the main cooling surface 11 of the casing 10 has a first tapered portion formed to extend along the component contact surface 12. The second tapered portion 22 of the heat radiating plate 20D is formed to slide with respect to a part of the first tapered portion. The second tapered portion 22 of the heat radiating plate 20E is formed to slide with respect to another part of the first tapered portion.

The heat radiating plate 20D inserted into the casing 10 is displaced forward in the X direction by the second tapered portion 22 being slid with respect to the first tapered portion, until the heat generating component 110D is brought into contact with the component contact surface 12. Likewise, the heat radiating plate 20E inserted into the casing 10 is displaced forward in the X direction by the second tapered portion 22 being slid with respect to the first tapered portion, until the heat generating component 110E is brought into contact with the component contact surface 12. Assuming that as in the heat radiating plate 20 on the rear row side in FIG. 4, another heat radiating plate is provided ahead of the heat radiating plate 20D in the X direction, the heat radiating plate 20D is displaced forward in the X direction until the heat generating component 110D is brought into contact with the heat radiating plate on the fore side in the X direction. Further, when another heat radiating plate is provided ahead of the heat radiating plate 20E in the X direction, the heat radiating plate 20E is displaced forward in the X direction until the heat generating component 110E is brought into contact with the heat radiating plate on the fore side in the X direction.

In this embodiment, the plurality of heat radiating plates 20D and 20E are arranged side by side in the Y direction. Thus, even when the component height of the heat generating component 110D and the component height of the heat generating component 110E are different from each other, the heat radiating plate 20D and the heat radiating plate 20E can be displaced forward in the X direction independently of each other. That is, the heat radiating plate 20D is displaced forward in the X direction until the heat generating component 110D is brought into contact with the component contact surface 12 or the heat radiating plate on the fore side in the X direction regardless of the component height of the heat generating component 110E. The heat radiating plate 20E is displaced forward in the X direction until the heat generating component 110E is brought into contact with the component contact surface 12 or the heat radiating plate on the fore side in the X direction regardless of the component height of the heat generating component 110D. Thus, it is not required to form a protrusion/recess portion in the inner side surface of the casing 10 or the heat radiating plate in accordance with the component height of the heat generating component. Therefore, the shape of the inner side surface of the casing 10 or the shape of the heat radiating plate can be simplified. Further, when two or more heat radiating plates are arranged in the X direction, all of those heat radiating plates can have the same shape.

Further, in this embodiment, the plurality of heat radiating plates 20D and 20E are split from each other, and hence it is possible to avoid thermal interference between the heat generating component 110D mounted to the substrate 30D and the heat generating component 110E mounted to the substrate 30E via the heat radiating plate.

As described above, the electric power converter described in each of the first to eleventh embodiments includes: the casing 10; a heat radiating unit configured to radiate heat of the casing 10 to an outside; a first heat radiating plate having a first main surface and a second main surface which are opposite to each other; and a first substrate which is fixed to the first main surface and to which a first heat generating component is mounted. In this example, the cooling device 9, the coolant flow path 111, and the protrusion/recess portion 112 are each an example of the "heat radiating unit". The heat radiating plate 20, the heat radiating plate 20A, the heat radiating plate 20B, and the heat radiating plate 20D are each an example of the "first heat radiating plate". The substrate fixing surface 25, the main surface 25A, the main surface 25B, and the main surface 25D are each an example of the "first main surface". The component contact surface 24 and the main surface 24A are each an example of the "second main surface". The MOSFET 2, the transformer 3, the diode 4, the smoothing reactor 5, the core 7, the heat generating component 110, and the heat generating component 110D, and heat generating component 110E are each an example of the "first heat generating component". The substrate 30, the substrate 30A, the substrate 30B, and the substrate 30D are each an example of the "first substrate".

The casing 10 has the inner side surface in which the first tapered portion 13 is formed. The first heat radiating plate includes a second tapered portion which is connected to the first tapered portion 13 in a heat exchangeable manner and slid with respect to the first tapered portion 13. The first heat radiating plate is configured to be displaced in a first direction with respect to the casing 10 by the second tapered portion being slid with respect to the first tapered portion 13. The first heat generating component is connected to the casing 10 in a heat exchangeable manner by the first heat radiating plate being displaced in the first direction. Here, the fore side in the X direction in FIG. 4, FIG. 7, FIG. 14, FIG. 17, FIG. 24, FIG. 27, FIG. 33, FIG. 42, FIG. 43, FIG. 46, FIG. 47, and FIG. 50 and the fore side in the Y direction in FIG. 35, FIG. 36, FIG. 39, and FIG. 40 are each an example of the "first direction". The second tapered portion 22 and the second tapered portion 34 are each an example of the "second tapered portion.

With this configuration, the first heat generating component mounted to the first substrate can be more reliably connected to the casing 10 in a heat exchangeable manner. With this, more heat radiation paths from the first heat generating component to the heat radiating unit are ensured, and hence a heat resistance in the heat radiation paths can be reduced. It is therefore possible to obtain a compact electric power converter capable of effectively radiating heat of the first heat generating component.

The above-mentioned electric power converter may further include, as the heat radiating unit, the cooling device 9 mounted to an outer side surface of the casing 10. With this configuration, heat of the first heat generating component can be effectively radiated via the cooling device 9.

The above-mentioned electric power converter may further include, as the heat radiating unit, a cooling mechanism provided inside the casing 10. The coolant flow path 111 is an example of the "cooling mechanism". With this configuration, heat of the first heat generating component can be effectively radiated via the cooling mechanism provided inside the casing 10. Further, with this configuration, the heat radiation path from the first heat radiating plate to the heat radiating unit can be shortened, and hence heat of the first heat generating component can be more effectively radiated.

The above-mentioned electric power converter may further include a heat conductive member provided between the first heat generating component and an inner side surface of the casing 10 opposite to the first heat generating component. The heat radiating sheet 50 and the potting resin are each an example of the "heat conductive member". With this configuration, an area of heat transfer between the first heat generating component and the inner side surface of the casing 10 can be increased.

In the above-mentioned electric power converter, the first direction may be a direction parallel to a normal direction of the first main surface. The X directions in FIG. 4, FIG. 7, FIG. 14, FIG. 17, FIG. 24, FIG. 27, FIG. 33, FIG. 42, FIG. 43, FIG. 46, FIG. 47, and FIG. 50 are each an example of the "direction parallel to the normal direction of the first main surface".

In the above-mentioned electric power converter, the first direction may be a direction parallel to the first main surface. The Y directions in FIG. 35, FIG. 36, FIG. 39, and FIG. 40 are each an example of the "direction parallel to the first main surface".

In the above-mentioned electric power converter, the casing 10 may include a metal block protruding from an inner side surface of the casing 10 opposite to the first heat generating component. The first heat generating component may be connected to the metal block in a heat exchangeable manner. The first metal block 27A and the second metal block 27B are each an example of the "metal block".

In the above-mentioned electric power converter, a heat conductive member such as a heat radiating sheet or a potting resin may be provided between the first heat generating component and the metal block.

In the above-mentioned electric power converter, the first heat radiating plate may have the fixing hole 29, and the fixing hole 29 has an elongated hole shape extending in the first direction and passes through the first heat radiating plate in a direction perpendicular to the inner side surface of the casing 10 in which the first tapered portion 13 is formed. The first heat radiating plate may be fixed to the casing 10 with the fixing screws inserted into the fixing holes 29. The main cooling surface 11 is an example of the "inner side surface". The vertical direction of FIG. 42 and FIG. 43 is an example of the "direction perpendicular to the inner side surface". The heat radiating plate-fixing screw 60 is an example of the "fixing screw". With this configuration, as the fixing screw is fastened more tightly, the first heat radiating plate is more displaced in the first direction, and hence a degree of adhesion between the first heat generating component and the casing 10 can be increased.

The above-mentioned electric power converter may further include: the elastic member 70 provided at an end portion of the first heat radiating plate on an opposite side to the second tapered portion; and the fixing member 16 mounted to the casing 10 and configured to hold the elastic member 70 in a compressed state between the fixing member and the end portion of the first heat radiating plate. With this configuration, the restoring force of the elastic member 70 allows the first heat radiating plate to be slid to move in the first direction along the first tapered portion 13 irrespective of the direction of the gravity. Therefore, a degree of freedom in the installation posture of the electric power converter can be enhanced.

The above-mentioned electric power converter may further include: a second heat radiating plate having a third main surface and a fourth main surface which are opposite to each other; and a second substrate which is fixed to the third main surface and to which a second heat generating component is mounted. The heat radiating plate 20C and the heat radiating plate 20E are each an example of the "second heat radiating plate". The main surface 25C and the main surface 25E are each an example of the "third main surface". The main surfaces 24C and 24E are each an example of the "fourth main surface". The substrate 30C and the substrate 30E are each an example of the "second substrate". The heat generating component 110 mounted to the substrate 30C and the heat generating component 110 mounted to the substrate 30E are each an example of the "second heat generating component".

The inner side surface of the casing 10 may have a third tapered portion. The first tapered portion extending along the inner side surface 12C in FIG. 47, and the first tapered portion extending along the component contact surface 12 in FIG. 50 are each an example of the "third tapered portion". The second heat radiating plate may include a fourth tapered portion which is connected to the third tapered portion in a heat exchangeable manner and slid with respect to the third tapered portion. The second tapered portion 22 of the heat radiating plate 20C and the second tapered portion 22 of the heat radiating plate 20E are each an example of the "fourth tapered portion". The second heat radiating plate may be configured to be displaced in the second direction with respect to the casing 10 by the fourth tapered portion being slid with respect to the third tapered portion. The fore side in the Y direction of FIG. 47 and the fore side in the X direction of FIG. 50 are each an example of the "second direction". The second heat generating component may be connected to the casing 10 in a heat exchangeable manner by the second heat radiating plate being displaced in the second direction.

In the above-mentioned electric power converter, the first direction and the second direction may form an angle of 90°. The fore side in the X direction and the fore side in the Y direction of FIG. 47 are an example of the "first direction" and an example of the "second direction".

In the above-mentioned electric power converter, the first direction and the second direction may form an angle of 180°.

The above-mentioned electric power converter may further include: a third heat radiating plate having a fifth main surface and a sixth main surface which are opposite to each other; and a third substrate which is fixed to the fifth main surface and to which a third heat generating component is mounted. The third heat radiating plate is provided behind the first heat radiating plate in the first direction. In FIG. 2 and FIG. 4, the heat radiating plate 20 located on the rear side in the X direction is an example of the "third heat radiating plate". In FIG. 2 and FIG. 4, the heat radiating plate 20 located on the fore side in the X direction is an example of the "first heat radiating plate". In FIG. 2 and FIG. 4, the substrate fixing surface 25 of the heat radiating plate 20 on the rear side in the X direction is an example of the "fifth main surface". An opposite surface to this substrate fixing surface 25 is an example of the "sixth main surface". In FIG. 2 and FIG. 4, the substrate 30 fixed to the heat radiating plate 20 located on the rear side in the X direction is an example of the "third substrate". The core 7 mounted to this substrate 30 is an example of the "third heat generating component".

The inner side surface of the casing 10 may have a fifth tapered portion. The first tapered portion 13 on the rear side in the X direction in FIG. 4 is an example of the "fifth tapered portion". The third heat radiating plate may include a sixth tapered portion which is connected to the fifth tapered portion in a heat exchangeable manner and slid with respect to the fifth tapered portion. In FIG. 4, the second tapered portion 22 included in the heat radiating plate 20 located on the rear side in the X direction is an example of the "sixth tapered portion". The third heat radiating plate may be configured to be displaced in the first direction with respect to the casing 10 by the sixth tapered portion being slid with respect to the fifth tapered portion. The third heat generating component may be connected to the first heat radiating plate in a heat exchangeable manner by the third heat radiating plate being displaced in the first direction.

With this configuration, the third heat generating component mounted to the third substrate can be more reliably connected to the first heat radiating plate in a heat exchangeable manner. With this, more heat radiation paths from the third heat generating component to the heat radiating unit are ensured, and thus a heat resistance in the heat radiation paths can be reduced. It is therefore possible to obtain a compact electric power converter capable of effectively radiating heat of the heat generating component.

REFERENCE SIGNS LIST

2 MOSFET (heat generating component), 3 transformer (heat generating component), 4 diode (heat generating component), 5 smoothing reactor (heat generating component), 6 smoothing capacitor, 7 core (heat generating component), 7a bottom surface, 9 cooling device, 10 casing, 11 main cooling surface, 12 component contact surface, 12B, 12C inner side surface, 13 first tapered portion, 13a perpendicular surface, 14, 14A slit, 14a outline, 15 radiating plate-fixing screw hole, 16 fixing member, 20, 20A, 20B, 20C, 20D, 20E heat radiating plate, 22 second tapered portion, 24 component contact surface, 24A, 24B, 24C, 24D, 24E main surface, 25 substrate fixing surface, 25A, 25B, 25C, 25D, 25E main surface, 26 recess, 26a bottom surface, 27 metal block, 27A first metal block, 27B second metal block, 28 screw hole, 29 fixing hole, 30, 30A, 30B, 30C, 30D, 30E substrate, 31 substrate fixing hole, 32 core-specific opening, 33 substrate surface, 34 second tapered portion, 40 spacer, 50 heat radiating sheet (heat conductive member), 60 heat radiating plate-fixing screw, 70 elastic member, 71 E-type core, 72 I-type core, 80 fixing metal fitting, 81 casing mounting portion, 82 heat radiating plate mounting portion, 83 coupling portion, 84 elongated hole, 85 screw hole, 90 screw, 90a, 90b, 91a, 91b connection terminal, 92 input terminal, 93 output terminal, 94 connection line, 95 input line, 96 output line, 100, 101, 102, 103, 104 electric power converter, 110, 110D, 110E heat generating component, 111 coolant flow path, 112 protrusion/recess portion, 200 electric power converter

The invention claimed is:

1. An electric power converter, comprising:
   a casing;
   a first heat radiating plate having a first main surface and a second main surface which are opposite to each other; and
   a first substrate which is fixed to the first main surface and to which a first heat generating component is mounted,
   wherein the casing has an inner wall surface in which a first tapered portion is formed,
   wherein the first heat radiating plate includes a second tapered portion which is connected to the first tapered portion in a heat exchangeable manner and slid with respect to the first tapered portion,
   wherein the second tapered portion has an inclined surface that is inclined with respect to the first main surface and the second main surface,
   wherein the first heat radiating plate is configured to be displaced in a first direction with respect to the casing by the second tapered portion being slid with respect to the first tapered portion, and
   wherein the first heat generating component is connected to the casing in a heat exchangeable manner by the first heat radiating plate being displaced in the first direction.

2. The electric power converter according to claim 1, wherein a heat conductive member is provided between the first heat generating component and the inner wall surface of the casing opposite to the first heat generating component.

3. The electric power converter according to claim 1, wherein the first direction is a direction parallel to a normal direction of the first main surface.

4. The electric power converter according to claim 1, wherein the first direction is a direction parallel to the first main surface.

5. The electric power converter according to claim 4,
wherein the casing includes a metal block protruding from the inner wall surface of the casing opposite to the first heat generating component, and
wherein the first heat generating component is connected to the metal block in a heat exchangeable manner.

6. The electric power converter according to claim 5, wherein a heat conductive member is provided between the first heat generating component and the metal block.

7. The electric power converter according to claim 1,
wherein the first heat radiating plate has a fixing hole, and the fixing hole has an elongated hole shape extending in the first direction and passes through the first heat radiating plate in a direction perpendicular to the inner wall surface of the casing in which the first tapered portion is formed, and
wherein the first heat radiating plate is fixed to the casing with a fixing screw inserted into the fixing hole.

8. The electric power converter according to claim 1, further comprising:
an elastic member provided at an end portion of the first heat radiating plate on an opposite side to the second tapered portion; and
a fixing member mounted to the casing and configured to hold the elastic member in a compressed state between the fixing member and the end portion of the first heat radiating plate.

9. The electric power converter according to claim 1, further comprising:
a second heat radiating plate having a third main surface and a fourth main surface which are opposite to each other; and
a second substrate which is fixed to the third main surface and to which a second heat generating component is mounted,
wherein the casing has the inner wall surface in which a third tapered portion is formed,
wherein the second heat radiating plate includes a fourth tapered portion which is connected to the third tapered portion in a heat exchangeable manner and slid with respect to the third tapered portion,
wherein the second heat radiating plate is configured to be displaced in a second direction with respect to the casing by the fourth tapered portion being slid with respect to the third tapered portion, and
wherein the second heat generating component is connected to the casing in a heat exchangeable manner by the second heat radiating plate being displaced in the second direction.

10. The electric power converter according to claim 9, wherein the first direction and the second direction form an angle of 90°.

11. The electric power converter according to claim 9, wherein the first direction and the second direction form an angle of 180°.

12. The electric power converter according to claim 1, further comprising:
a third heat radiating plate having a fifth main surface and a sixth main surface which are opposite to each other; and
a third substrate which is fixed to the fifth main surface and to which a third heat generating component is mounted,
wherein the third heat radiating plate is provided behind the first heat radiating plate in the first direction,
wherein the casing has the inner wall surface in which a fifth tapered portion is formed,
wherein the third heat radiating plate includes a sixth tapered portion which is connected to the fifth tapered portion in a heat exchangeable manner and slid with respect to the fifth tapered portion,
wherein the third heat radiating plate is configured to be displaced in the first direction with respect to the casing by the sixth tapered portion being slid with respect to the fifth tapered portion, and
wherein the third heat generating component is connected to the first heat radiating plate in a heat exchangeable manner by the third heat radiating plate being displaced in the first direction.

13. The electric power converter according to claim 1, further comprising a heat radiating unit configured to radiate heat of the casing to an outside.

14. The electric power converter according to claim 13, further comprising, as the heat radiating unit, a cooling device mounted to an outer wall surface of the casing.

15. The electric power converter according to claim 13, further comprising, as the heat radiating unit, a cooling mechanism provided inside the casing.

* * * * *